US009960883B1

(12) United States Patent
Chakraborty

(10) Patent No.: US 9,960,883 B1
(45) Date of Patent: May 1, 2018

(54) TRANSMIT/RECEIVE BEAMFORMING SIGNAL GENERATION

(71) Applicant: Texas Instruments Incorporated, Dallas, TX (US)

(72) Inventor: Sudipto Chakraborty, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 15/488,434

(22) Filed: Apr. 14, 2017

(51) Int. Cl.
| | |
|---|---|
| *H04L 1/00* | (2006.01) |
| *H03M 13/41* | (2006.01) |
| *H03M 13/00* | (2006.01) |
| *G06F 7/487* | (2006.01) |
| *G06F 7/496* | (2006.01) |

(52) U.S. Cl.
CPC .......... *H04L 1/0054* (2013.01); *G06F 7/4876* (2013.01); *G06F 7/496* (2013.01); *H03M 13/41* (2013.01); *H03M 13/658* (2013.01); *H03M 13/6597* (2013.01)

(58) Field of Classification Search
CPC ..... H04L 1/0054; G06F 7/4876; G06F 7/496; H03M 13/41; H03M 13/658; H03M 13/6597
See application file for complete search history.

(56) References Cited

U.S. PATENT DOCUMENTS

| | | | |
|---|---|---|---|
| 2005/0141630 A1* | 6/2005 | Catreux | H04B 7/0854 375/267 |
| 2005/0195915 A1* | 9/2005 | Raleigh | H04B 7/0615 375/267 |
| 2007/0218850 A1* | 9/2007 | Pan | H03D 7/1441 455/189.1 |
| 2010/0225386 A1* | 9/2010 | Bax | H04L 27/3818 329/304 |

* cited by examiner

*Primary Examiner* — Freshteh N Aghdam
(74) *Attorney, Agent, or Firm* — John R. Pessetto; Charles A. Brill; Frank D. Cimino

(57) ABSTRACT

Transmit and/or receive beamforming signal generation includes a voltage-controlled oscillator (VCO) for generating a lower or higher master frequency output signal in accordance with a selection of a lower or higher frequency carrier frequency. A local oscillator generates local oscillator signals in quadrature in response to the maser frequency output signal. One or more mixer stages generate sidebands in response to a received information signal and the local oscillator signals in quadrature. The one or more mixer stages generate an output information signal in response to high-side injection of lower sidebands of the developed sidebands when the lower frequency carrier frequency is selected, and generate the output information signal in response to low-side injection of higher sidebands of the developed sidebands when the higher frequency carrier frequency is selected. Multi-band operation of transmit and receive arrays can be performed.

20 Claims, 15 Drawing Sheets

TRANSMIT/RECEIVE BEAMFORMING SIGNAL GENERATION

BACKGROUND OF THE INVENTION

Next-generation communication systems include multiple-input, multiple-output (MIMO) transceivers to accommodate high data throughput in wireless transmission systems. For example, transmitters in MIMO systems are often arranged as an array of transmitter elements, where each transmitter element is coupled to respective antenna, and where individual antennas are often physically separated from an adjacent antenna by a fraction of the wavelength (e.g., a half wavelength) at a selected radio frequency (RF). Each of the transmitter elements in the array can be phase shifted with respect to adjacent transmitter elements (e.g., contiguous transmitter elements arranged in a row or column). The phase shifting of adjacent transmitter elements generates a higher effective output power based on constructive addition of electromagnetic waves in space (e.g., as compared to the sum of the average power out of each of the individual transmitter elements). Each of the transmitter elements is driven by a relatively complex RF circuit such that the relative cost of the RF circuits is a substantial portion of a system cost.

SUMMARY

In described examples, a low power transmit and/or receive antenna array system is arranged for enhancing effective power of a transmitted waveform. In at least one embodiment, trigonometric weighted vector modulation techniques for beam-focusing transmitter and phase-based waveform reconstruction are described. The techniques for trigonometric weighted vector modulation include (for example) baseband scalar weighting and quadrature-phased signals at LO (local oscillator) and RF frequencies. Multiband operation of the transmit and receive arrays are performed in accordance with different sidebands at two or more LO frequencies combined in response to quadrature signals generated by moderate tuning range voltage-controlled oscillators (VCOs) such that, for example, a moderate tuning range VCO can be used in generating signals for a relatively wide range of operating frequencies. The local oscillator (LO) frequencies are generated coherently using reconfigurable frequency divider and multipliers. The described embodiment provides minimum signal loading at baseband frequencies, provides low distortion due to the current mode operation and sideband combination using up- and/or down-converter mixers, and permits lower power and area consumption for transmit/receive arrays.

DETAILED DESCRIPTION

Figure 1A:
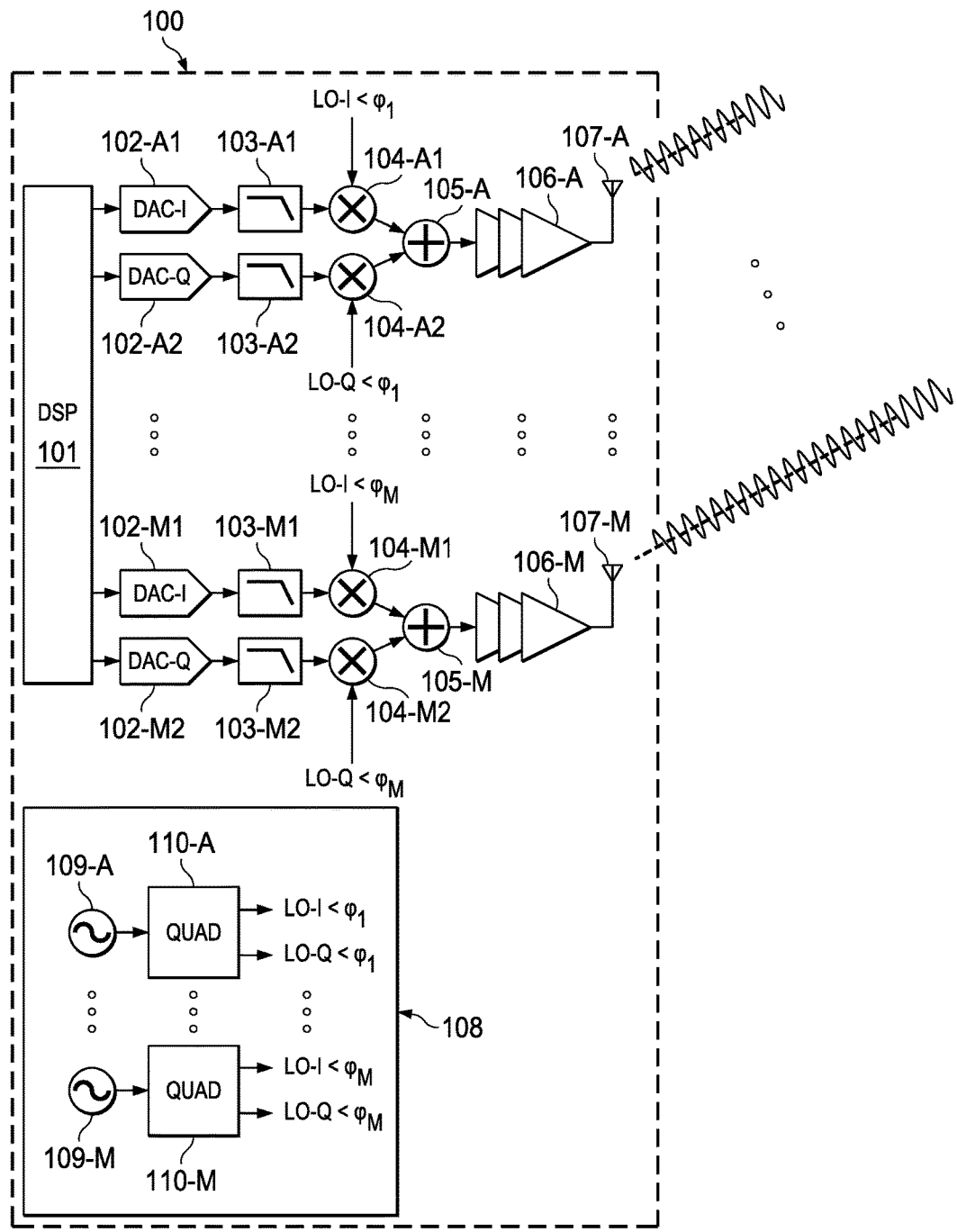
FIG. 1A is a schematic diagram of an architecture of a beamforming MIMO transmitter 100.

Certain terms are used throughout the following description—and claims—to refer to particular system components. Various names can be used to refer to a particular component (or system) wherein distinctions are not necessarily made herein between components that differ in name but not function. Further, a system can be a sub-system of yet another system. In the following discussion and in the claims, the terms "including" and "comprising" are used in an open-ended fashion, and accordingly are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion. The term "components" can mean portions of a signal introduced into the signal in earlier (e.g., "upstream") operations upon the signal.

As described herein, MIMO- (multiple-input, multiple-output-) based transmitters and receivers achieve higher effective output and input power by controlling an array of multiple low power transmitter and receiver elements for working concurrently and in parallel with like elements. For example, transmitter elements include an "in-phase" digital-to-analog converter (DAC), an in-phase baseband analog filter for modulating the output of the in-phase DAC, a quadrature DAC, a quadrature baseband analog filter for modulating the output of the quadrature DAC, an up-converting mixer for combining the outputs of the in-phase and quadrature baseband filters, and amplifiers for amplifying the output of the up-converting mixer and for coupling the amplified output to a respective antenna. Each of the number M of multiple low power transmitter elements works concurrently, for example, where each power transmitter element transmits a respective signal having a different phase shift from the signals being transmitted by adjacent transmitter elements. (Adjacent transmitter elements can include contiguous transmitter elements arranged in a row and/or column.) The cooperation of the concurrently working multiple transmitter elements increases, for example, the effective transmitted power (e.g., via focusing the transmitted beam) and/or the signal-to-noise ratio of the transmitted waveforms.

Similarly, MIMO-based receivers include an array of receiver elements, where each power receiver element is coupled to a respective antenna in an antenna array, where individual antennas are physically separated from an adjacent antenna by a faction of wavelength (e.g., half wavelength). A receiver element includes, for example, amplifiers for amplifying the input signal received from a respective antenna, an in-phase filter for filtering the amplified input signal, an in-phase analog-to-digital converter (ADC) for digitizing the in-phase filtered amplified input signal and coupling the digitized in-phase values to a digital signal processor (DSP), a quadrature filter for filtering the amplified input signal, quadrature ADC for digitizing the quadrature filtered amplified input signal and coupling the digitized quadrature values to the DSP. The DSP is a "back-end" processor arranged to phase shift and combine each of the digitized quadrature values from each respective receiver element such that, for example, the effective gain of the antenna array is boosted.

For example, each of the M receiver elements in the receiver element array is selectively phase shifted for constructive combination by receiver back-end (e.g., digital) processing of the signals received by the selectively phase shifted M receiver elements in the receiver element array. The constructive combination of the receiver back-end processing achieves a higher signal-to-noise (SNR) ratio for the combined signal when compared to any one of the individually received signals (e.g., based on each copy of the signals being correlated and constructively added in-phase, while noise is uncorrelated). Spatial filtering of the received signals is achieved, for example, by constructive combination of a receiver back-end processing. Accordingly, the back-end processing results in higher effective signal-to-noise ratio as compared to the SNR of each of the individual waveforms of the received signal obtained from a respective receiver element.

MIMO transmitters and receivers (e.g., including transceivers) are used extensively in emerging applications such as automotive radar as well as data communication integrated circuits (ICs) for next-generation communication systems (e.g., 5G-level services). To improve efficiencies, communication systems using MIMO technologies are typically implemented in a compact, power efficient manner. To improve cost effectiveness, a maximally reusable architecture is described as being scalable in accordance with certain designated multiple radio frequency (RF) bands of usage (e.g., where emerging systems are designed for operation within the 28 GHz and 35 GHz bands). Such systems are proposed to use array of between 16 and 512 antennas (e.g., in accordance with a power of two) using large arrays of compact antennas for handheld devices and base stations, where the handheld devices and the base stations include tiles, where each tile contains four antenna arrays. In various embodiments, receivers and transmitters are described for processing two center frequencies (e.g., 28 GHz and 35 GHz).

As system complexity and levels of integration grow, MIMO-based systems increasingly employ transmitter and receivers of low power and low area for achieving commercially viable solutions. In accordance with various communications standards, a single-sideband RF output is often required at the antenna (e.g., antenna array).

In a first transmitter architecture, signals in quadrature (e.g., having an in-phase signal and a quadrature signal in a quadrature phase relationship to the in-phase signal) at baseband frequencies are mixed with stages of quadrature local oscillator signals (e.g., for generating single sideband RF transmit signals for transmission). The first transmitter architecture is typically suitable for integrated system-on-chip implementation.

In a second transmitter architecture, the transmitter generates the signals in quadrature by phase shifting band-limited local oscillator analog signals (e.g., where the single sideband RF transmit signals for transmission are generated by one or more mixer stages, where each mixer stage is responsive to local oscillator signals in quadrature, where the local oscillator signals in quadrature are generated in accordance with a selected frequency).

The first and second transmitter architectures are applicable to respective first and second receiver architectures where, for example, the output of the down-conversion RF circuitry can be a differential signal (in accordance with the first receiver embodiment) or quadrature differential signals at analog/baseband frequency levels (in accordance with the second receiver embodiment).

Various transmitter architectures using mixers for generating output signals are responsive to quadrature input signals and quadrature local oscillator (LO) signals in accordance with:

$$\cos(\omega_{LO}+\omega_{BB})t = \cos(\omega_{LO}t)\cos(\omega_{BB}t) - \sin(\omega_{LO}t)\sin(\omega_{BB}t) \quad \text{(Eq. 1)}$$

where $\omega_{BB}$ is a first quadrature input signal at a baseband frequency, $\omega_{LO}$ is a second quadrature input signal having a frequency higher than a baseband frequency and t is time. The first and second quadrature input signals each include a first signal and a second signal having the frequency of the included first signal and having a 90-degree phase relationship with the included first signal.

FIG. 1A is a schematic diagram of an architecture of a beam-focusing MIMO transmitter 100. The digital signal processing element 101 is arranged for back-end signal processing (e.g., processing of signals for transmitting and processing of digitized received signals). The digital signal processing element 101 generates transmit data and phase information for transmitting a selected output signal. The transmit data and phase information is transferred to a number M of quadrature DACs (to digital-to-analog converters 102-A1 and 102-A2 for a first channel and to a sequence of (e.g., the selected number of) M channels extending to DACs 102-M1 and 102-M2 for the last channel). The number M of baseband filters (103-A1 and 103-A2 and a sequence of baseband filters extending to 103-M1 and 103-M2) are arranged for reducing aliasing and harmonics of the respective baseband signal generated by the respective quadrature digital-to-analog converters (e.g., DACs 102-A1 and 102-A2 through 102-M1 and 102-M2). After the baseband signal is filtered by the anti-aliasing filters (e.g., filters 103-A1 and 103-A2 through 103-M1 and 103-M2), the filtered baseband signals are respectively up-converted using a number M of up-converting quadrature mixers (mixers 104-A1 and 104-A2 through 104-M1 and 104-M2), which output a respective up-converted signal coupled to an input of a number M of the high frequency power amplifiers (106-A and the sequence of amplifiers extending to 106-M). The outputs of the high frequency power amplifiers are respectively coupled to each the antennas (107-A and the sequence of antennas extending to 107-M). The beam-focusing MIMO transmitter 100 includes a phase shifter 108 for generating LO signals and quadrature.

Figure 1B:
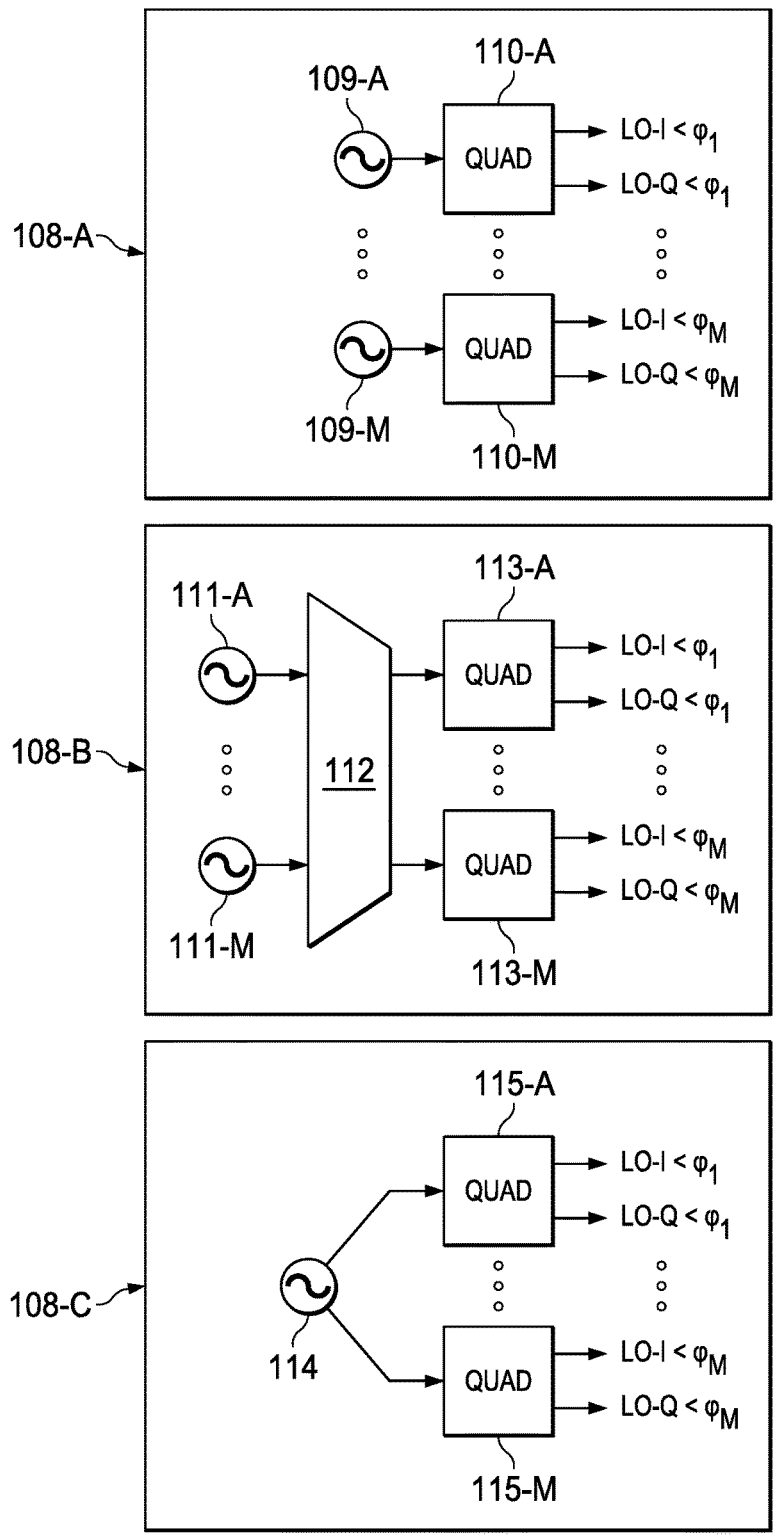
FIG. 1B is a schematic diagram of various example embodiments of a phase shifter 108 for generating LO signals and quadrature.

FIG. 1B is a schematic diagram of various example embodiments of a phase shifter 108 for generating LO signals and quadrature. For example, phase shifter 108 can be a phase shifter in accordance with any of 108-A, 108-B, and 108-C phase shifter embodiments.

The phase shifter 108-A includes a number M voltage-controlled oscillators (VCOs 109-A and the sequence of VCOs extending to 109-M), where each of the M number of VCOs (e.g., 109) includes an output coupled to a respective set of inputs of each of the quadrature (QUAD) dividers (110-A and the sequence of dividers extending to 110-M). The phase shifter 108-A embodiment is suitable (for example) for VCOs where each such VCO covers a narrow tuning range, and where many such VCOs (e.g., where each of the VCOs covers a different frequency range of a larger frequency range) are used to cover an entire frequency range of coverage (e.g., by selecting a particular VCO capable of operating at a target frequency within the frequency range of coverage). The respective outputs (e.g., LO-I and LO-Q) of each of the quadrature dividers (e.g., 110-A through 110-M) are output to a respective mixer in accordance with ("<") signals $\varphi_1$ through $\varphi M$. The quadrature divider outputs are differentially coupled to respective up-converting mixers (e.g., a respective pair of the up-converting mixers 104).

The phase shifter 108-B shows a configuration where the oscillators (111-A through 111-M) are multiplexed via a multiplexer 112, which in turn selectively outputs a selected baseband signal generated by a selected one of a number M VCOs (111-A and the sequence of VCOs to 111-M) and provided the selected output to the number M of quadrature dividers (113-A and the sequence of dividers to 113-M) to obtain the quadrature outputs for respectively coupling to a respective pair of the number of M mixers (e.g., up-converting mixers) 104.

The phase shifter 108-C shows a configuration where the output of a VCO 114 is provided to a number M of quadrature dividers (115-A through 115-M), where each quadrature divider 115 provides quadrature outputs coupled to a respective M quadrature up-conversion mixer. Accordingly, the phase shifter 108-C is suitable for receiving an input signal from a wide tuning range VCO.

Figure 2:
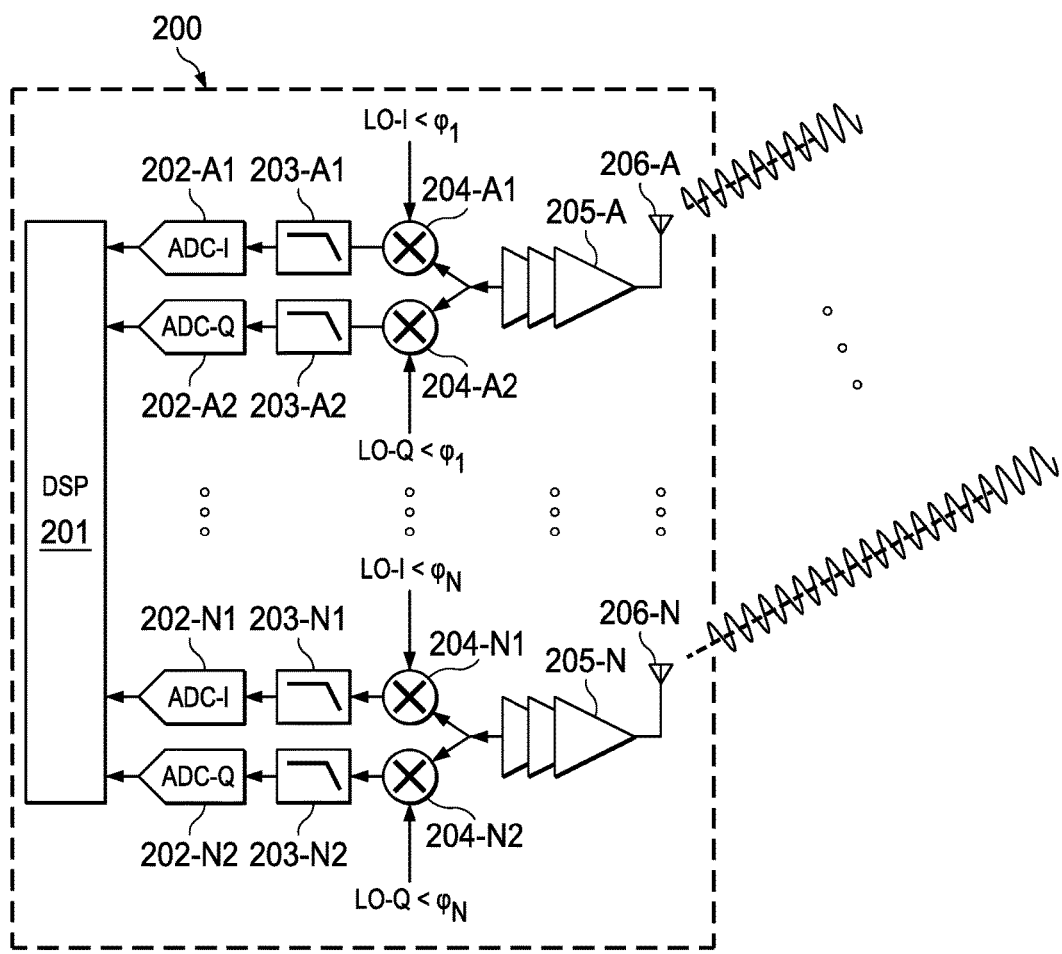
FIG. 2 is a schematic diagram of an architecture of a beamforming MIMO receiver.

FIG. 2 is a schematic diagram of an architecture of a beam-focusing MIMO receiver. A multipath receiver 200 includes an array of cooperating receiver elements. A number N of front-end antennas (206-A through 206-N) are respectively coupled to a number N of low noise amplifiers (LNAs 205-A through 205-N). Outputs from the LNAs are respectively coupled to a respective differential input of a corresponding number N of low-pass baseband filters (filters 203-A1 and 203-A2 through 203-N1 and 203-N2) respectively. The outputs from the low-pass baseband filters (e.g., 203) are respectively coupled in quadrature to respective pairs of the number N of the analog-to-digital converters (ADCs 202-A1 and 202-A2 through 202-N1 and 202-N2). The outputs of the analog-to-digital converters (e.g., ADCs 202) are coupled to the receiver digital signal processor 201, where the DSP 201 is arranged to process each respective digital output stream such that, for example, the directional lobes of the front-end antennas are effectively oriented by software control (which, for example, enhances directional gain and increases signal-to-noise ratios).

Figure 3:
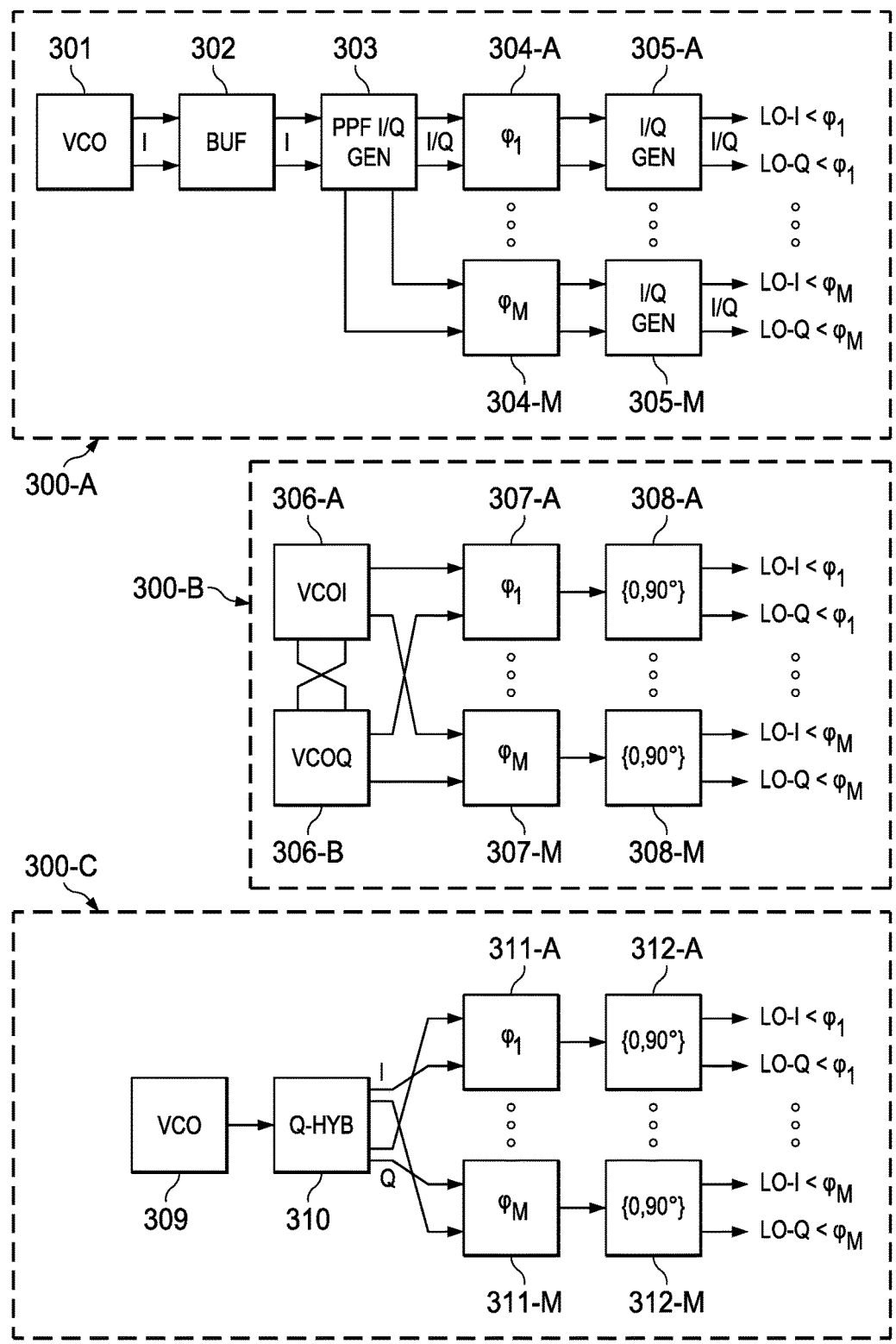
FIG. 3 is a schematic diagram of VCO polyphase quadrature signal generation circuits.

FIG. 3 is a schematic diagram of VCO polyphase quadrature signal generation circuits. For example, VCO polyphase quadrature signal generation circuits can be VCO polyphase quadrature signal generation circuits in accordance with any of 300-A, 300-B, and 300-C.

Quadrature generator 300-A is a single-VCO polyphase quadrature signal generator and includes a differential VCO 301 for coupling a (e.g., in-phase) differential signal to a buffer 302, which in turn drives (e.g., using in-phase differential signaling) the polyphase quadrature generator (PPF I/Q GEN) 303. The polyphase quadrature generator 303 is arranged to generate output pairs for each of the in-phase signal I and quadrature signal Q, which are respectively coupled to a number M of phase shifters 304-A through 304-M, where each phase shifter (e.g., 304) is arranged to phase shift a respective coupled input signal pair. Each phase shifter 304 is arranged to operate in accordance with the phase shift operations:

$$\cos(\omega_{LO}t-\varphi_x)=\alpha\cos(\omega_{LO}t)+\beta\sin(\omega_{LO}t), \text{ where } \tan(\varphi_x)=\beta/\alpha \quad \text{(Eq. 2)}$$

$$\sin(\omega_{LO}t-\varphi_x)=\alpha\sin(\omega_{LO}t)-\beta\cos(\omega_{LO}t) \quad \text{(Eq. 3)}$$

where $\varphi_x$ is a selected phase shift for each transmitter (or receiver) element. The parameters $\alpha$ and $\beta$ are individually controllable via software (e.g., under control of software executing on DSP 201) for each phase shifter (e.g., 304-A) and are selected to control the phase shift provided by an individual phase shifter (e.g., 304-A). Each phase shifter in a transmitter element is programmed with a potentially different value for $\alpha$ and $\beta$, where $\alpha_i \neq \alpha_j$, and $\beta_i \neq \beta_j$, for example, where i and j indicate a particular adjacent transmitter elements.

The differential output of each phase shifter (e.g. one of 304) is respectively coupled to a respective differential input of one of a number M of individual quadrature generators (305-A through 305-M). The output pair (which includes in-phase "I" and quadrature-phase "Q" signals) of each quadrature generator (e.g., one of 305) is coupled to the quadrature and in-phase inputs of a respective up-converting mixer (e.g., 104 or 204). The quadrature generator 300-A consumes relatively large amounts of power and area, in part based on the number of buffers 302 for compensating the signal loss associated with the polyphase phase shifter networks. Further, the buffers 302 also increase out-of-band phase noise based on the associated thermal noise contribution.

Quadrature generator 300-B is a dual-VCO quadrature signal generator in accordance with the quadrature signal generator method introduced above. In general, quadrature generator 300-B includes two VCOs each of which includes cross-coupled outputs for generating quadrature signals. The quadrature generator 300-B includes two cross-coupled VCOs 306-A (VCOI) and 306-B (VCOQ). The VCOs 306-A and 306-B provide quadrature outputs, which can be vector summed using a number M of vector modulators (e.g., vector modulators 307-A through 307-M) for phase shifting input signals in accordance with Eq. 2 and Eq. 4. The outputs of the vector modulators (e.g., 307) are coupled to respective inputs of M cooperating (e.g., concurrently working together) quadrature phase shifters 308-A through 308-M. Each of the quadrature phase shifters (e.g., 308) includes differential quadrature outputs, which are coupled to respective inputs of a respective transmitter mixer (e.g., one of the up-converting mixers 104). The quadrature generator 300-B occupies a relatively large area (e.g., often consumed by the VCO inductors) and entails increased cross-talk resulting from included inductive components.

Quadrature generator 300-C is a single-VCO passive-quadrature phase-shifting generator in accordance with the single-VCO passive-quadrature phase-shifting method introduced above. In general, quadrature generator 300-C includes a single VCO 308, which includes a (e.g., differential) output coupled to a quadrature hybrid (Q-HYB) 309 (e.g., in accordance with transmission line theory). The differential outputs of the quadrature hybrid 309 can be vector summed using a number M of vector modulators (310-A through 310-M) for phase shifting input signals in accordance with Eq. 2. The outputs of each of the vector modulators (e.g., 310) are coupled to a respective input of one of the number of M concurrently working quadrature phase shifters (311-A through 311-M). Each of the quadrature phase shifters (e.g., 311) includes differential quadrature outputs, which are coupled to respective inputs of a respective transmitter mixer (e.g., one of the up-converting mixers 104). The quadrature phase shifters (e.g., 311) can be implemented using quadrature hybrid manufacturing technology.

In a transceiver architecture, phase shifting can be provided by: (a) baseband or low frequency transceiver circuitry, (b) LO or signal generation frequency transceiver circuitry, and/or (c) RF (e.g., transmit/receive) circuitry. In a transmitter architecture, phase shifting can be performed in baseband or LO frequency circuitry because (for example) a single sideband combination is determined in response to the baseband or LO frequencies. Performing phase shifting at RF frequency consumes power and occupies area of a substrate. In a receiver architecture, phase shifting can be performed in RF or LO frequency circuitry. Generally, phase shifting is performed using circuitry operating at LO frequencies in part due to the higher phase accuracies obtained in the signal generation, as well as less noise contribution compared to the phase shifter operation in the signal path (operating in low frequency baseband or RF bands).

Figure 4:
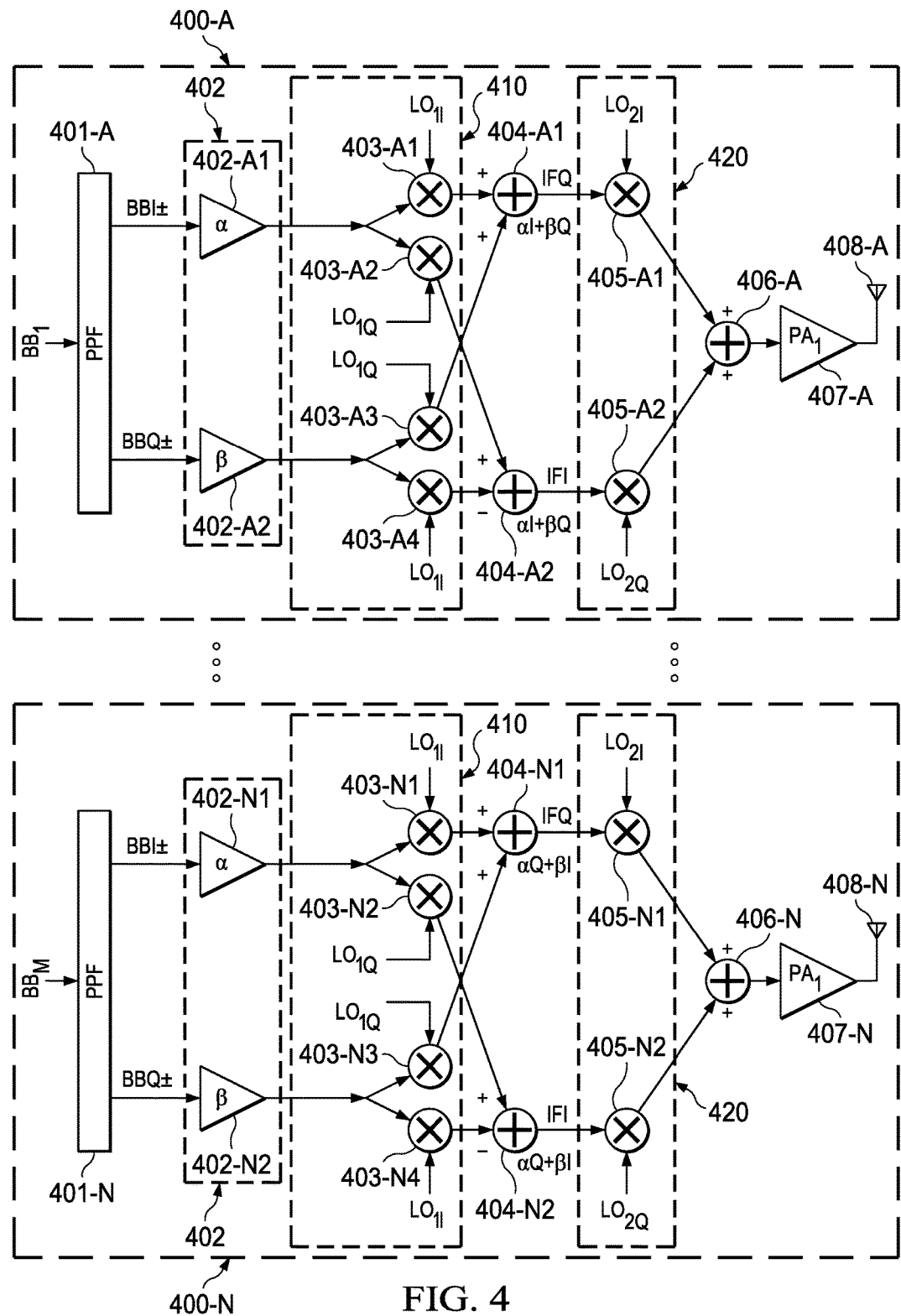
FIG. 4 is a schematic diagram of an architecture of a transmitter elements of a beam-focusing MIMO transmitter including cross-coupled quadrature mixer elements in accordance with example embodiments.

FIG. 4 is a schematic diagram of an architecture of a transmitter elements of a beam-focusing MIMO transmitter including cross-coupled quadrature mixer elements in accordance with example embodiments. The MIMO transmitter includes a number N of transmitter elements (400-A through 400-N), where each transmitter element works in parallel (and concurrently) with other such transmitter elements to generate output signals for combining spatially when radiated by the respective antennas. Accordingly, each of the N transmitter elements 400-A through 400-N cooperate as elements of a MIMO transmitter arranged for transmitting output signals for combining spatially (e.g., for improving effective power and directivity by constructive interference of spatially combined transmitted waveforms). The baseband functionality of each transmitter element (e.g., 400-A) can be implemented using integrated circuit technologies different from the integrated circuit technologies used to implement the RF functionality (e.g., baseband circuit portions can be manufactured using CMOS technologies and RF circuit portions can be manufactured using silicon germanium).

Each of the transmitter elements includes a number N of polyphase phase shifters (e.g., PPFs 401-A through 401-N) at the input of each transmitter element (e.g., one of transmitter elements 400). The polyphase phase shifters (e.g., 401-A to 401-N) can use differential inputs (e.g., coupled from the outputs of a buffer 302) or quadrature inputs input (e.g., coupled from the outputs of a polyphase quadrature generator 303) in accordance with a particular system application. The inputs of the polyphase phase shifter are arranged to receive a baseband input information signal (BB') generated by, for example, a DAC programmed by processor in accordance with information to be transmitted. When the baseband input is differential, the polyphase phase shifter (e.g., one of PPFs 401) processes the baseband signal by quadrature phase shifting and filtering. The degree of phase shift can optionally be formed as "hard-wired" and/or "selectable alternatives (e.g., programmable switches activated) after deployment" using analog and/or digital techniques.

The polyphase phase shifters (e.g., PPF 401-A) are arranged as multiple stages of low pass and high pass filters, having low pass and high pass cutoffs determined as single-order time-constants. In some embodiments, the polyphase phase shifters are arranged 1) to obtain quadrature phases of a given waveform, and 2) to perform phase shifting. The degree of phase shifting is determined by a vector summation of orthogonal phases using a scalar factor (parameters $\alpha$ and $\beta$). For example, the phase shift is determined in accordance with $\varphi(t)=\alpha*I(t)+\beta*Q(t)$, which is dependent of the I(t) and Q(t) provided by the quadrature signals, which are respectively attenuated by the parameters $\alpha$ and $\beta$.

Outputs of the polyphase phase shifters 401 are coupled to the trigonometric weighting scalers (e.g., 402-A1 and 402-A2 through 402-N1 and 402-N2). Each of the trigonometric scalers (e.g., one of 402) provides an attenuated version of the input signal in accordance with the trigonometric scaling factors $\alpha$ and $\beta$. The attenuation factors are determined for one or more design applications (e.g., at boot time by the DSP 101 or initially by a circuit designer) based on the degree of phase shift to be performed by the transmitter element (e.g., 400-A) in accordance with Eq. 2 and Eq. 3. The outputs of the trigonometric weighting scalers 402 are coupled to a first mixer stage 410 of quadrature mixer elements (e.g., 403-A1, 403-A2, 403-A3, 403-A4 through 403-N1, 403-N2, 403-N3, 403-N4).

The output currents from the quadrature mixer elements 403-A1 and 403-A3 are summed together using (e.g., wire-implemented) combiner 404-A1 to obtain a first phase shifted version of input baseband signal up-converted to an IF frequency in accordance to Eq. 2. Similarly, the output currents from the quadrature mixer elements 403-A2 and 403-A4 are subtracted from each other using (e.g., wire-implemented) combiner 404-A2 to obtain a second phase shifted version of input baseband signal up-converted to an IF frequency in accordance with Eq. 3.

Accordingly, the outputs of combiners 404-A1 and 404-A2 are quadrature phase signals (signals in quadrature) at an IF frequency where the IF frequency is the sum of the baseband frequency and the first local oscillator frequency (e.g., IF=LO1+BB). The output of combiner 404-A1 is generated in accordance with $\alpha I+\beta Q$ (see Eq. 2) whereas the output of combiner 404-A2 is generated in accordance with $\alpha Q-\beta I$ (see Eq. 3). The output of the combiners 404-A1 and 404-A2 (e.g., which is the quadrature IF signal) are coupled to a second mixer stage 420 of quadrature mixers 405-A1 and 405-A2. Generally, the outputs of the first mixer stage 410 of quadrature mixers are respectively coupled to respective inputs of the second mixer stage 420 of quadrature mixers (which operate in accordance with LO signals different from the LO signals of the first mixer stage 410).

Expanding Eq. 1 in accordance with at least two quadrature stages of the LO signal:

$$\begin{aligned}\cos(\omega_{LO1}+\omega_{LO2}+\omega_{BB})t &= \cos(\omega_{LO1}t)\cos(\omega_{LO2}t)\cos\\&\quad(\omega_{BB}t)-\sin(\omega_{LO1}t)\sin(\omega_{LO2}t)\cos(\omega_{BB}t)-\sin\\&\quad(\omega_{LO1}t)\cos(\omega_{LO2}t)\sin(\omega_{BB}t)-\cos(\omega_{LO1}t)\sin\\&\quad(\omega_{LO2}t)\sin(\omega_{BB}t)\end{aligned}$$ (Eq. 4)

where $\omega_{LO1}$ is a second quadrature input signal having a frequency higher than the baseband frequency and $\omega_{LO2}$ is a third quadrature input signal having a frequency higher than the baseband frequency and different from the frequency of $\omega_{LO1}$. In various embodiments, the example basic single-sideband combination of quadrature phases at each of the constituent signals shown in (Eq. 1) and (Eq. 4) above can be extended to include multiple stages of quadrature input signals (e.g., including more than three frequencies).

A single-sideband output signal is generated in response to quadrature phasing for each of the quadrature input signals. For example: for a single-stage up-conversion, the baseband and LO frequencies are each provided in quadrature; and for a two-stage up-conversion, each of the three components (baseband, first LO and second LO) are provided in quadrature.

The quadrature generation at baseband frequencies are often implemented using analog circuit techniques cost-effective for low frequencies, while the quadrature generation circuitry at higher LO frequencies are generally more expensive (e.g., including in terms of both power and area). Additionally, the circuitry for quadrature generation at both baseband frequency levels and LO frequency levels are relatively specific for selected frequencies. For a single design to work across various selected frequencies, additional circuitry is included as a reusable transceiver circuit design to accommodate changes in frequency plans (e.g., in accordance with different frequency usage assignment in different countries), for which the transceiver circuit is to be used in cell phones of different carriers. For example, a transmitter designed to operate at both 28 GHz (e.g., in the United States and Europe) and 35 GHz (e.g., in Japan) can consume relatively large substrate areas due to quadrature hybrids arranged to operate at a selected one of the two frequencies.

Each of the transmitter elements 400-A through 400-N are programmed in accordance with different values of α and β, leading to the required phase granularity (e.g., of 180/N) of the beam-focusing transmitter array. Accordingly, the trigonometric weighting scalers 402 are for phase shifting the output information signal (e.g., generated in response to an input information signal received from a processor for encoding and transmission) of the transmitter element in accordance with a phase shift selected by the system DSP for spatial combination (e.g., through constructive combination) of the transmitted waveforms of adjacent transmitter elements.

As discussed below with respect to FIG. 9, trigonometric scaling is optionally implemented using a factor for scaling the mixers. The mixers can be scaled, for example, by segmenting a baseband transistor for driving an associated up-conversion combiner 404 into functional smaller segments and selecting one or more of the functional smaller segmented transistors. The baseband transistor can be segmented by paralleling smaller transistors and selecting (e.g., via mask programming or programmable transistor switches) various ones of smaller transistors such that the selected transistors scale in accordance with a selected trigonometric ratio.

Before amplification and transmission, the first and second LO stage frequencies (e.g., LO1 and LO2) are both generated in quadrature and are received from the LO generation blocks 500-A and 500-B (described below with respect to FIG. 5).

Combiner elements of the up-conversion combiners (e.g., 404-A1 and 404-A2 through 404-N1 and 404-N2) are arranged to combine input signals in (e.g., an electrical) current mode by, for example, connecting two wires together without additional components. The wired combiner connections save both power, area, and avoids linearity limitations because of no additional active circuit components existing in the associated signal path.

The baseband shifter (e.g., 401), the scalar amplifier (e.g., 402), the filter (e.g., 403), and an up-combiner (e.g., 404) of a transmitter element (e.g., 400-A) are arranged for vector modulations. Accordingly, baseband phase shifters (e.g., one of 401), scalar amplifiers (e.g., an associated one of 402), filters (e.g., an associated one of 403), and an up-converter (e.g., current summing) mixers (e.g., an associated one of 404) are vector modulators. The outputs of the vector modulators are respectively coupled to the second stage of the respective mixers (e.g., 405-A and 405-B to 405-N and 405-N). The second stage of mixers 405 receives a second set of quadrature signals (e.g., $LO_{2I}$, $LO_{2Q}$) from the LO signal generation elements (e.g., 500-A or 500-B).

Outputs from the second stage of the mixers (e.g., 405-A and 405-B) in each transmitter element are coupled to a respective combiner (e.g., current summer 406-A through 406-N) to generate a single sideband output. The current summers are combiners implemented as a (e.g., wired) connection (which does not require any active circuitry, conserves circuit power and area, and avoids signal distortion, which helps preserve the dynamic range of the signal being summed). Output signals from the current summers (e.g., 406-A through 406-N) are coupled to respective power amplifiers (e.g., 407-A through 407-N), which are selected for providing amplification of respective output signals at a selected center frequency of interest.

In an embodiment, the current summers 406 and the power amplifiers 407 can be eliminated, and the current summation (otherwise performed by the current summers 406) can occur at the antenna by coupling the outputs of a pair of up-converting mixers (e.g., combiners 404-A and 404-B having cross-coupled inputs) directly together at the antenna. Coupling the outputs of the respective pairs of up-converting combiners at the antenna provides relatively high degrees of linearity when, for example, coupling the combiners (such as discussed below with reference to FIG. 9 and FIG. 10) to inductively loading antennas, which can be configured for near-field communication.

Cost-effective, next-generation MIMO systems optionally include the circuitry to reconfigure transmitter elements to different operating frequencies such that, for example, the same mobile hardware circuits can be used in multiple countries over the world (e.g., wherein individual countries might allocate frequency "spectrum" differently from other countries). Two commonly used frequency bands include RF center frequencies of 28 GHz and 35 GHz. Accordingly, reconfigurable transmitter and receiver elements are described herein for operating in these bands. (Some of the front-end tuning elements have off-substrate components, which can be relatively easily changed, and which facilitates adaptation for different antenna dimensions and structures used for optimum performance.)

Two embodiments for quadrature signal generation at a given frequency of interest are discussed. A first embodiment includes a quadrature generation for a sinusoidal tone, which can be the output of the VCO. The output of the VCO can be coupled as the LO signal, where the LO is a relatively low frequency signal such that VCO can be relatively easily tuned in accordance with a specified transmitter frequency. As transmitter frequencies changes from 28 GHz to 35 GHz, a wide tuning range VCO and a wideband quadrature phase shifter can be used to accommodate the change in frequency. In a second embodiment, a different set of tuning elements (e.g., resonators for VCO and phase shifter elements for the quadrature) can be formed by changing metal masks during integrated circuit manufacture of a circuit in accordance with the second embodiment.

In both embodiments a processor (such as a DSP) is arranged to program and/or reprogram the local oscillator (e.g., multiplication order operation units 500-A or 500-B discussed below, which are arranged to perform multiplication order operations such as multiplication and division in response to selected integers) for generating first and second LO signals in accordance with a first carrier frequency and for generating first and second LO signals in accordance with a second carrier frequency. (The DSP is also arranged to program various polyphase phase shifters, trigonometric weighting scalers, selecting transistor segments of multi-segment transistors of mixers—see FIG. 9 and FIG. 10, for example—and other frequency-dependent configurable circuitry.)

Various methods for generating a LO signal at high frequencies include: (a) a frequency-doubled method in which a VCO operating at twice the (e.g. transmitter) frequency is further divided by a factor of 2 (e.g., such that the doubled frequency is divided by 4); (b) a single-VCO polyphase-quadrature phase-shifting method in which a VCO operates at the same frequency as the transmitter, but is phase shifted for beam-focusing operations in response to polyphase quadrature generation; (c) a dual-VCO method in which two VCOs are cross-coupled with each other to generate quadrature signals and are phase shifted for beam-focusing operations in response to polyphase quadrature generation; and (d) a single-VCO passive-quadrature phase-shifting method in which a single VCO is phase shifted for beam-focusing operations in response to being coupled to a passive quadrature hybrid for generating quadrature signals, where the generated quadrature signals are phase shifted for the beam-focusing transmitter array.

The frequency-doubled method described above for generating a LO signal high frequencies, for example, includes a VCO having a relatively wide tuning range (at least plus or minus 20 percent of a center frequency output), where the VCO is arranged to operate at 56 GHz and 70 GHz respectively for generating output frequencies of either 28 GHz or 35 GHz. The frequency-doubled method entails relatively large amounts of layout space and power (for example, multiple VCOs can be provided, where each VCO has a different frequency range such that a wide frequency tuning range is accommodated by selecting a different VCO in accordance with a selected transmission frequency).

Figure 5:
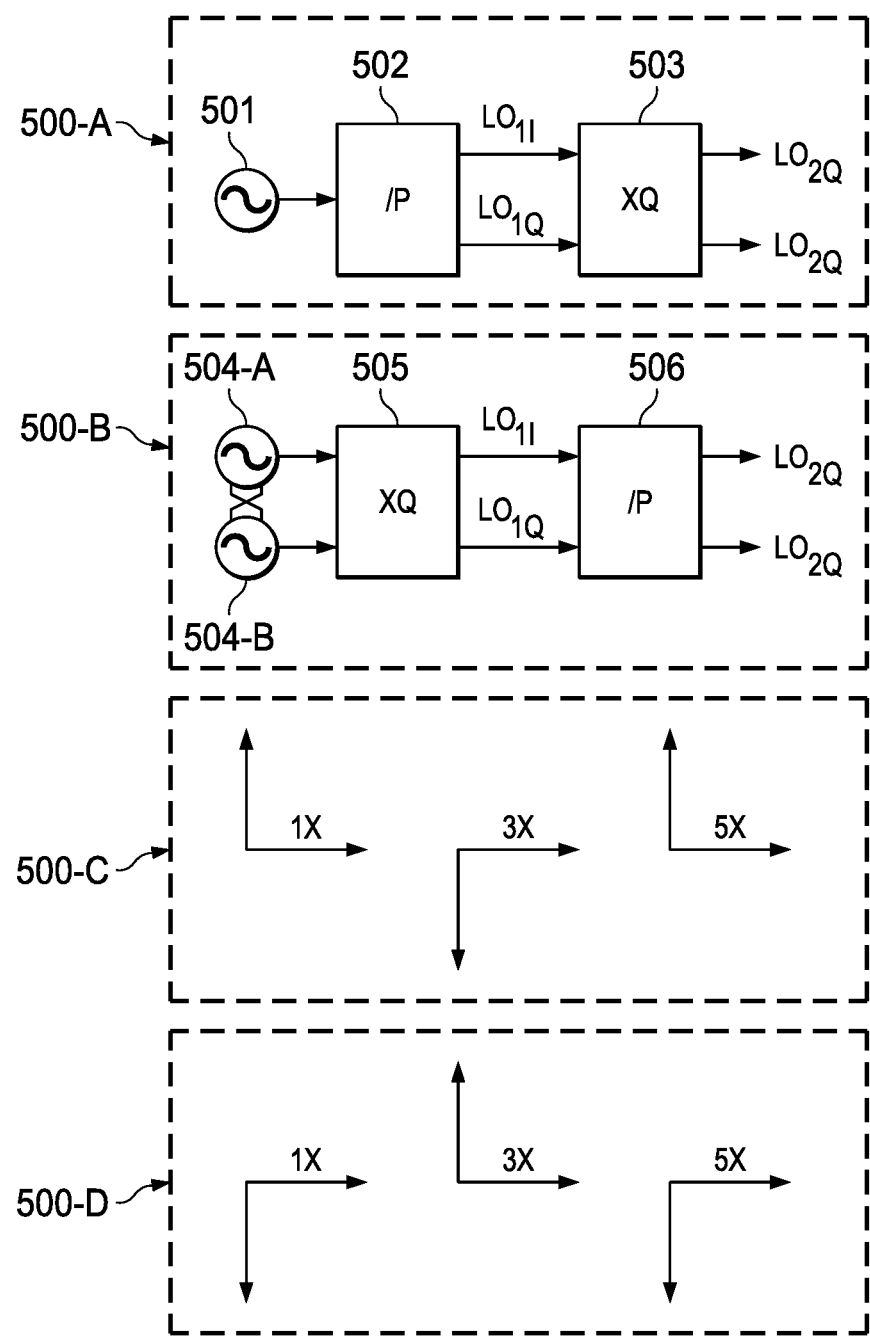
FIG. 5 is a schematic diagram of local oscillators (LO) for modulating transmitter elements of a beam-focusing MIMO transmitter in accordance with example embodiments.

FIG. 5 is a schematic diagram of local oscillators (LO) for modulating transmitter elements of a beam-focusing MIMO transmitter in accordance with example embodiments. In general, a local oscillator includes a single phase locked loop (PLL) VCO for driving for frequency dividers and multipliers. The signal generation path is arranged as a fully differential architecture, which lessens transmission line effects associated with power and ground lines. A fully differential design is generally more immune to linearly translated common-mode cross-talk induced by, for example, fluctuations in voltages in structures and/or busses of the power supply, ground, and/or substrate. Accordingly, the signal distribution in the described embodiment is fully differential (e.g., starting from the output of a differential VCO and continuing to the output of a mixer interface).

In various embodiments, the local oscillator includes a VCO for generating differential signals as a master frequency signal. The master frequency signal is coupled differentially to a multiplication-order operation unit, which is arranged to generate a first derived frequency signal (e.g., a first LO output signal) in response to the master frequency signal in accordance with a first multiplication-order operation (e.g., either division or multiplication), and for generating a second derived frequency signal (e.g., a second LO output signal) in response to the first derived frequency signal in accordance with a second multiplication-order operation (e.g., either multiplication or division), wherein the second multiplication-order operation is a multiplication-order operation that is inverse to the first multiplication-order operation. In the single-oscillator embodiment and the dual-oscillator embodiment discussed below, the multiplication-order operation unit executes integer frequency division and integer frequency multiplication operations pon of respective signal inputs.

In a single-oscillator embodiment, the LO 500-A includes a VCO 501 for generating the master frequency signal. The VCO 501 master frequency signal is coupled to an even-integer divider 502. The even-order divider 502 divides the VCO frequency by an even integer P. For simplicity of the embodiment, P can be a number derived from a cascade of divide-by-two circuits (e.g., modulo-2 division). The even-order divider 502 can include a cascade of even/odd dividers coupled with a divide-by-2 divider (e.g., such that the input frequency is divided by an even number). The even-order divider 502 outputs an evenly divided frequency as a fifty-percent duty signal in differential quadrature phases.

The even-order divider 502 output is coupled to an odd-order frequency multiplier 503, which multiplies the input frequency by an integer Q. The frequency multiplier 503 is typically implemented using an injection-locked frequency multiplier or an overdriven multiplier for converting energy from fundamental frequency to odd-order harmonics. Accordingly, the two frequencies generated from this LO generation system are given by:

$$LO_{1I}=LO/P<0°, LO_{1Q}=LO/P<90° \quad \text{(Eq. 5)}$$

$$LO_{2I}=LOQ/P<0°, LO_{2Q}=LOQ/P<90° \quad \text{(Eq. 6)}$$

where P is the even-divisor integer, Q is the odd-multiplier integer, and the "<" operator indicates the phase of the associated signal.

In accordance with Eq. 5 and Eq. 6, some embodiments of the up-conversion mixer elements in the transmitter array are described below as (A), (B), and (C).

(A) Up-conversion mixers are arranged to operate responsive to signals from a single LO (e.g., LO2) in accordance with:

$$RF=LOQ/P=>LO=P/QRF \quad \text{(Eq. 7)}$$

such that the VCO can be operated at a frequency lower than the RF frequency. When P=2 and Q=3, the VCO can operate at two-thirds of the RF frequency. For a 35 GHz RF carrier frequency, a VCO can operate at a center frequency of 24 GHz. Similarly, when P=2 and when Q=5, the VCO can operate at a frequency of two-fifths of the RF frequency. For a 35 GHz RF carrier frequency, a VCO can operate a center frequency of 14 GHz. The selection of the frequency multiplier and dividers achieves greater frequency tuning ranges, while consuming lower power using even (e.g., digital divide-by-2) dividers.

(B) Up-conversion mixers are arranged to operate responsive to signals combined from a pair of local oscillators (e.g., LO1 and LO2) in an additive manner. For example, the upper sideband is generated in part by a first mixer (e.g., 403-A1 and 403-A2 collectively) and the upper sideband is generated in part by a second mixer (e.g., 405-A1 and 405-A2 collectively). Alternatively, the lower sideband can be generated in part by the first mixer (e.g., 403-A1 and 403-A2 collectively) and in part by the upper sideband of the second mixer (e.g., 405-A1 and 405-A2 collectively).

In like manner, a two step up-conversion can also be performed in an additive manner (e.g., where the upper sideband is coupled as inputs for both stages of mixing). The up-conversion mixers are arranged to operate responsive to signals combined from a pair of local oscillators in an additive manner in accordance with:

$$RF = LO_1 + LO_2 = LO\frac{Q+1}{P} \Rightarrow LO = \frac{P}{Q+1}RF \qquad \text{(Eq. 8)}$$

For a given RF center frequency of 35 GHz and the values P=2 and Q=3 in an example, the VCO center operating frequency is 17.5 GHz, which is a sub-harmonic of the RF carrier frequency. Accordingly the architecture is (e.g., mathematically) immune to carrier frequency drift resulting from effects from parasitic coupling in responsive to high power amplifier (PA) array output power (e.g., because the parasitic inputs are direct multiples of the VCO output frequency).

Up-conversion mixers are arranged to operate responsive to signals combined from a pair of local oscillators (e.g., LO1 and LO2) in a subtractive manner (whereas swapping connections on the mixer inputs would cause the signals to be combined in an additive manner). For example, the upper sideband is generated by a first mixer (e.g., 403-A1 and 403-A2 collectively) and the upper sideband is generated by a second mixer (e.g., 405-A1 and 405-A2 collectively). Alternatively, the lower sideband can be generated by the first mixer (e.g., 403-A1 and 403-A2, collectively) and the upper sideband of the second mixer (e.g., 405-A1 and 405-A2 collectively).

In the embodiment, the single sideband transmitter TX can be realized using a single step up-conversion circuit, which includes for example $LO_{2I}$ and $LO_{2Q}$. For a direct up-conversion architecture, the frequencies from $LO_{2I}$ and $LO2_Q$ are combined in a subtractive manner (e.g., upper sideband generation is performed by the first mixer 403-A1, -A2 and lower sideband generation is performed by the second mixer 405-A1, -A2):

$$RF = LO_2 - LO_1 = LO\frac{Q-1}{P} \Rightarrow LO = \frac{P}{Q-1}RF \qquad \text{(Eq. 9)}$$

Accordingly, when P=2, Q=5, and the RF center frequency is 35 GHz, the VCO frequency becomes 17.5 GHz, which is a sub-harmonic of the RF carrier frequency, such that the architecture is (e.g., mathematically) immune to frequency deviations from high PA output power via various coupling mechanisms.

Vector diagrams 500-C and 500-D represent vectors of the output of frequency multipliers when a frequency multiplier receives a signal in quadrature. Vector diagram 500-C shows input vectors of 0 degrees and +90 degrees phases for I and Q (where the y-component Q is positive-negative-positive for the fundamental, third, and fifth harmonics, respectively). In contrast, vector diagram 500-D shows the vectors generated when the input signals are 0 and −90 degree phases for I and Q (where the y-component Q is negative-positive-negative for the fundamental, third, and fifth harmonics, respectively).

Because of the phasor rotation of the quadrature signal, the polarity of the quadrature signal at harmonics of input signal alternates (e.g., between +90 and −90 degrees) while the in-phase signal maintains the same vector position (e.g., 0 degrees). For an in-phase signal (e.g., where the I signal maintains a zero degree phase), the odd-order harmonics are of the same phasor (e.g., where the third and fifth harmonic signals are also of zero degree phase).

In contrast, the odd-order harmonics of a quadrature signal alternate polarities (e.g., change by 180 degrees) between each successive odd harmonic. For example, the vector diagram 500-C shows a quadrature phase of +90 degrees for the first (1X) harmonic, a quadrature phase of −90 (e.g., +270) degrees for the third harmonic, and a quadrature phase of +90 degrees for the fifth harmonic (e.g., which is the same quadrature phase angle of the first harmonic). Also for example, the vector diagram 500-D shows a quadrature phase of −90 degrees for the first (1X) harmonic, a quadrature phase of +90 degrees for the third (3X) harmonic, and a quadrature phase of −90 degrees for the fifth (5X) harmonic (e.g., which is the same quadrature phase angle of the first harmonic).

In an embodiment, the quadrature phase signals are inverted for multiplication of the third order harmonic after which the multiplied inverted harmonics are combined with (e.g., non-inverted) multiplied harmonics to generate a homogenous quadrature signal where the odd-order harmonics (e.g., at least the first and third) are of the same quadrature phase signal. The homogenous quadrature signal is coupled to the up-conversion mixers as the Q signal.

In an alternate embodiment, the quadrature phase signals are inverted for multiplication of the first and fifth order harmonics and combined with an (e.g., non-inverted) third order harmonic to generate the homogenous quadrature signal. In a fully differential embodiment, the dissimilar harmonics are inverted by reverse coupling of wires, such that (for example) additional power and layout area are not necessarily consumed.

In a dual oscillator embodiment, the LO 500-B includes dual VCOs 504, with the output of each VCO 504 coupled to a respective input of the quadrature amplifier 505. The dual VCOs 504 are cross-coupled to ensure common phase integrity. Accordingly, LO 500-B provides is similar to LO 500-A in that, for example, multiply operations are performed first and divisions are performed later. In the dual-oscillator embodiment, a quadrature VCO 504 is used to obtain the differential quadrature signals at a selected LO frequency. The quadrature VCOs 504 are coupled to quadrature multiplier 505, which is arranged to multiply the input frequency by amplifying (and homogenizing) odd-harmonic energy to multiply the input frequencies in accordance with the odd harmonics of the input frequencies. The homogenous multiplied frequency (in quadrature) is output by the quadrature multiplier 505 and is further coupled with even divider P 506. The outputs of the quadrature multiplier 505 are coupled and applied in a manner similar to the output of the frequency multiplier 503 described above. The LO 500-A and the LO 500-b can be applied to at least four embodiments described below as (A), (B), (C), and (D).

(A) A first embodiment includes single sideband up-conversion mixers using LO1 signals (e.g., only), where the quantities P and Q are mutually exchanged (e.g., swapped):

$$RF = LOQ => LO = 1/QRF \quad (Eq. 10)$$

Accordingly, when Q=3 and the RF center frequency is 35 GHz, the VCO frequency becomes 12.67 GHz, which is a sub-harmonic of the RF carrier frequency, such that the architecture is (e.g., mathematically) immune to frequency deviations from high PA output power via various coupling mechanisms.

(B) A second embodiment includes single-sideband up-conversion mixers using LO2 signals (e.g., only), where the quantities P and Q are mutually exchanged (e.g., swapped):

$$RF = LOP/Q => LO = Q/PRF \quad (Eq. 11)$$

Accordingly, when P=6, Q=3 and the RF center frequency is 35 GHz, the VCO frequency becomes 17.5 GHz, which is a sub-harmonic of the RF carrier frequency, such that the architecture is (e.g., mathematically) immune to frequency deviations from high PA output power via various coupling mechanisms.

(C) A third embodiment includes single-sideband up-conversion mixers using a combination of LO1 and LO2 in additive manner:

$$RF = LO_1 + LO_2 = LO\frac{Q(P+1)}{P} => LO = \frac{P}{Q(P+1)}RF \quad (Eq. 12)$$

Accordingly, when P=2, Q=3 and the RF center frequency is 35 GHz, the VCO frequency becomes 7.8 GHz, which is a sub-harmonic of the RF carrier frequency, such that the architecture is (e.g., mathematically) immune to frequency deviations from high PA output power via various coupling mechanisms. Note that Q=1 leads to a simple case of sliding IF architecture (where the ratio of the $LO_1/LO_2$ determines a division ratio in quadrature over the frequencies used in single sideband communications)

(D) A fourth embodiment includes single sideband up-conversion mixers using a combination of LO1 and LO2 in subtractive manner:

$$RF = LO_1 + LO_2 = LO\frac{Q(P+1)}{P} => LO = \frac{P}{Q(P-1)}RF \quad (Eq. 13)$$

Accordingly, when P=2, Q=3 and the RF center frequency is 35 GHz, the VCO frequency becomes 12.67 GHz, which is a sub-harmonic of the RF carrier frequency, such that the architecture is (e.g., mathematically) immune to frequency deviations from high PA output power via various coupling mechanisms. When P=4 and Q=3, the VCO center frequency becomes 15.6 GHz. From the two embodiments of quadrature LO signal generation schemes (e.g., LO 500-A and LO 500-B) described above, more flexibility can be obtained by having a programmable even order divider and a programmable odd-order multiplier (e.g., where P and/or Q are programmable by software executing on a processor). Similarly, the same VCO can be used to generate output frequencies over multiple selected frequency bands by generating a combination of a first sideband (upper or lower) for a first RF frequency band (e.g. 28 GHz), and a second sideband (lower or upper) for a second RF frequency band (e.g. 35 GHz). In order to achieve a smaller tuning range for the VCO, the second sideband is a sideband that is complementary to the first sideband (e.g., the first sideband is an upper sideband and the second sideband is the lower sideband). In accordance with the description herein, the tuning range of the VCO is reduced by using complementary sideband injection with respect to the VCO programmed to operate at a first operating frequency and a second operating frequency.

In a single mixing stage example using LO 500-A, where P=2, Q=3, and IF=2.5G and for a first carrier frequency of 28 GHz, a VCO generating a master frequency 17 GHz is indicated when the in-phase and quadrature-phase mixers are programmed for low-side injection (e.g., of the upper sideband). When the in-phase and quadrature-phase mixers are programmed for high-side injection (e.g., of the lower sideband), a VCO generating a master frequency 20.33 GHz (result A) is indicated for operating (assuming P=2, Q=3, and IF=2.5G and the first carrier frequency RF=28 GHz).

In the single mixing stage example using LO 500-A, where P=2, Q=3, and IF=2.5G and for a second carrier frequency of 35 GHz, a VCO generating a master frequency 21.67 GHz (result B) is indicated when the in-phase and quadrature-phase mixers are programmed for low-side injection (e.g., of the upper sideband). When the in-phase and quadrature-phase mixers are programmed for high-side injection (e.g., of the lower sideband), a VCO generating a master frequency 25 GHz is indicated for operating (assuming P=2, Q=3, and IF=2.5G and the first carrier frequency RF=35 GHz).

In the single mixing stage example using LO 500-A described above, the frequency difference between result A and result B is about 1.33 GHz such that a VCO with a tuning range as low as about 6.6 about (or about 7 percent) with an center operating frequency of around 21 GHz (which is the frequency midpoint between result A and result B) can be tuned to provide (for example) a master frequency signal for deriving LO signals in quadrature for driving mixers used to modulate (or demodulate) and information signal.

In various applications, the VCO operating frequency can be selected, and the second mixer stage and the second—e.g., "downstream"—multiplication-order operation can be programmably bypassed by selectively opening or closing switches (such as switch $S_1$ of 700-A) under software control or via mask programming. The selection of upper or lower sideband injection is also programmably selected through by selectively opening or closing switches under software control (for example, operating frequency of the VCO can be altered within the tuning range of the VCO by switchably changing the L/C value of the VCO timing circuit).

In a two mixing stage example using LO 500-A, where P=2, Q=3, and IF=2.5G and for a first carrier frequency of 28 GHz, a VCO generating a master frequency 12.75 GHz is indicated when the in-phase and quadrature-phase mixers are programmed for low-side injection (e.g., of the upper sideband). When the in-phase and quadrature-phase mixers are programmed for high-side injection (e.g., of the lower sideband), a VCO generating a master frequency 15.25 GHz (result X) is indicated for operating (assuming P=2, Q=3, and IF=2.5G and the first carrier frequency RF=28 GHz).

In the two mixing stage example using LO 500-A, where P=2, Q=3, and IF=2.5G and for a second carrier frequency of 35 GHz, a VCO generating a master frequency 16.25 GHz (result Y) is indicated when the in-phase and quadrature-phase mixers are programmed for low-side injection (e.g., of the upper sideband). When the in-phase and quadrature-phase mixers are programmed for high-side injection (e.g., of the lower sideband), a VCO generating a master frequency 18.75 GHz is indicated for operating (assuming P=2, Q=3, and IF=2.5G and the first carrier frequency RF=35 GHz).

In the two mixing stage example using LO 500-A described above, the frequency difference between result X and result Y is about 1 GHz such that a VCO with a tuning range as low as about 6.6 about (or about 7 percent) with an center operating frequency of around 15.75 GHz (which is the frequency midpoint between result A and result B) can be tuned to provide (for example) a master frequency signal for deriving LO signals in quadrature for driving mixers used to modulate (or demodulate) and information signal.

Accordingly, using a combination of one or two mixing stages and with upper and lower sideband (low and high-side injections), a lower frequency VCO can be used in the architecture, with moderate tuning range requirements. Moreover, the center frequency of the VCO is a non-integral submultiple of the RF frequency, which makes the architecture resistant to any frequency pulling effects from (e.g., parasitic coupling by) the PA.

Figure 6:
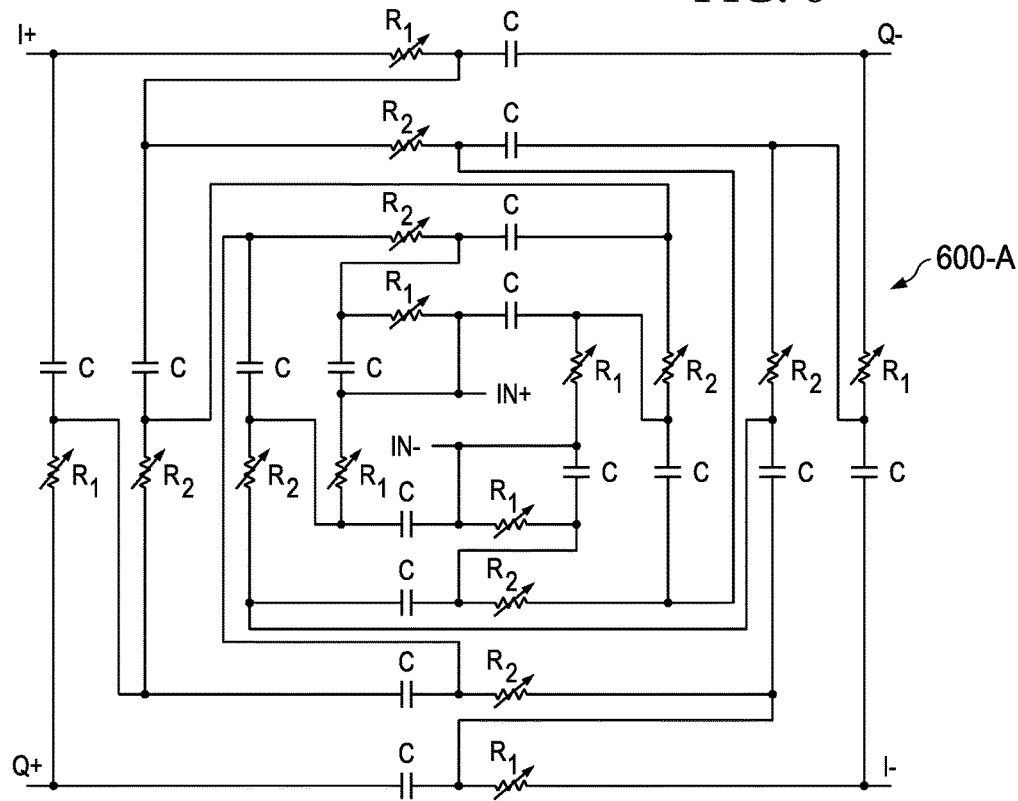
FIG. 6 is a schematic diagram of baseband phase shifter circuits in accordance with example embodiments.
Figure 6:
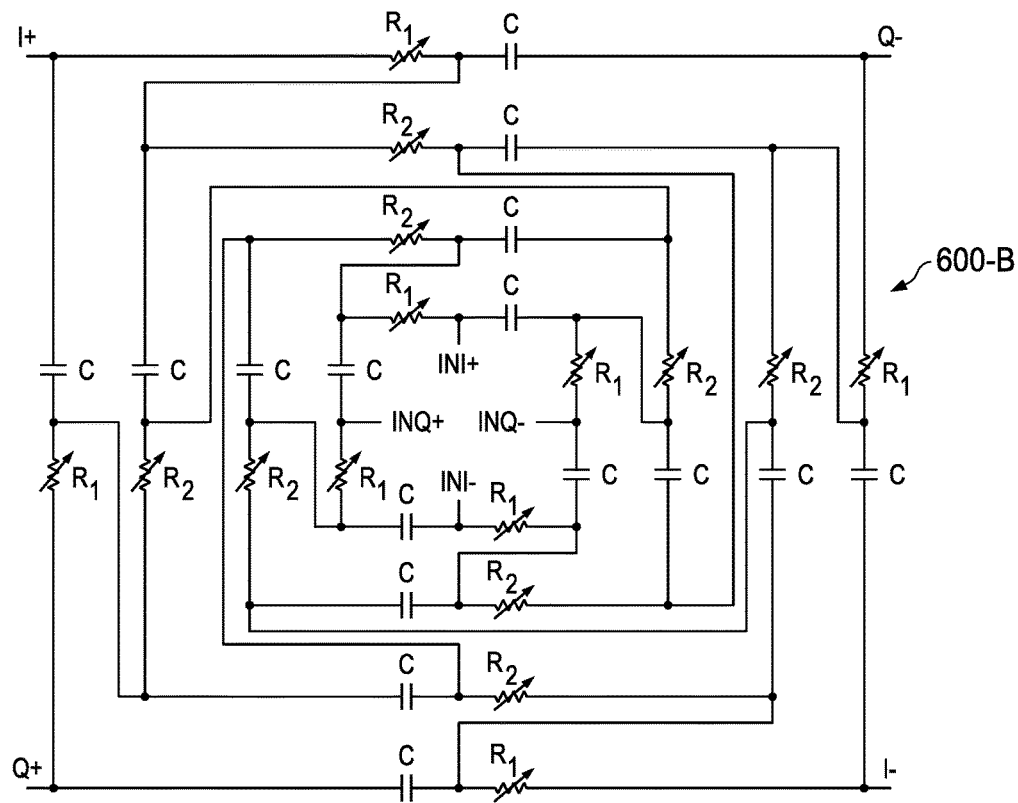

FIG. 6 is a schematic diagram of baseband phase shifter circuits in accordance with example embodiments. Phase shifters 600-A and 600-B are two embodiments of baseband phase shifter elements, which include a generally cyclical arrangement of resistors (instances of $R_1$ and $R_2$) and capacitor components (instances of C). Phase shifter 600-A is a polyphase phase shifter element for receiving a differential signal (IN+) from the baseband output and for generating quadrature signals (I+, I−, Q+, and Q−) for coupling to the outputs, which are coupled to the up-conversion mixers (discussed above). Phase shifter 600-B is a configuration polyphase phase shifter element for receiving a quadrature differential signal (INI+, INI−, INQ+, and INQ−) from the baseband output and for generating quadrature signals for coupling to the up-conversion mixers. Target applications include embodiments implemented in a system on-chip application, where the baseband signals can be efficiently generated in quadrature. The polyphase phase shifter element performs phase shifting, as well as filtering for reducing out-of-band DAC sampling aliasing.

The outputs from the baseband phase shifter element 600-A (or 600-B) are coupled to trigonometric scaling factor blocks (e.g., 402-A1, 402-A2 to 402-N1, 402-N2), which use scaling factors to scale the quadrature baseband signals. The scalar factors are responsible for the phase shift provided by the transmitter element, and are given by $\tan(\varphi_x)=\beta/\alpha$ as discussed above with reference to Eq. 2. The trigonometrical weights, $\alpha$, and $\beta$, can be implemented as a single attenuator element or a cascade of two or more attenuator elements. As an example, cascaded scalar weighting can be implemented as a product of two weight factors $\alpha_1$, $\beta_1$, and $\alpha_2$, $\beta_2$ in a manner that $\alpha=\alpha_1\alpha_2$, and $\beta=\beta_1\beta_2$. However, the transmitter elements in a cascaded array can be formed using a same architecture to maintain similar accuracy and phase balance metrics. A selected trigonometric weighting can include unit element-based structures (e.g., matched unit passive components such as resistors, capacitors, transistors etc.), and a trigonometric number mapped to its closest integer values (e.g. $\tan(22.5)=2/5$).

Figure 7:
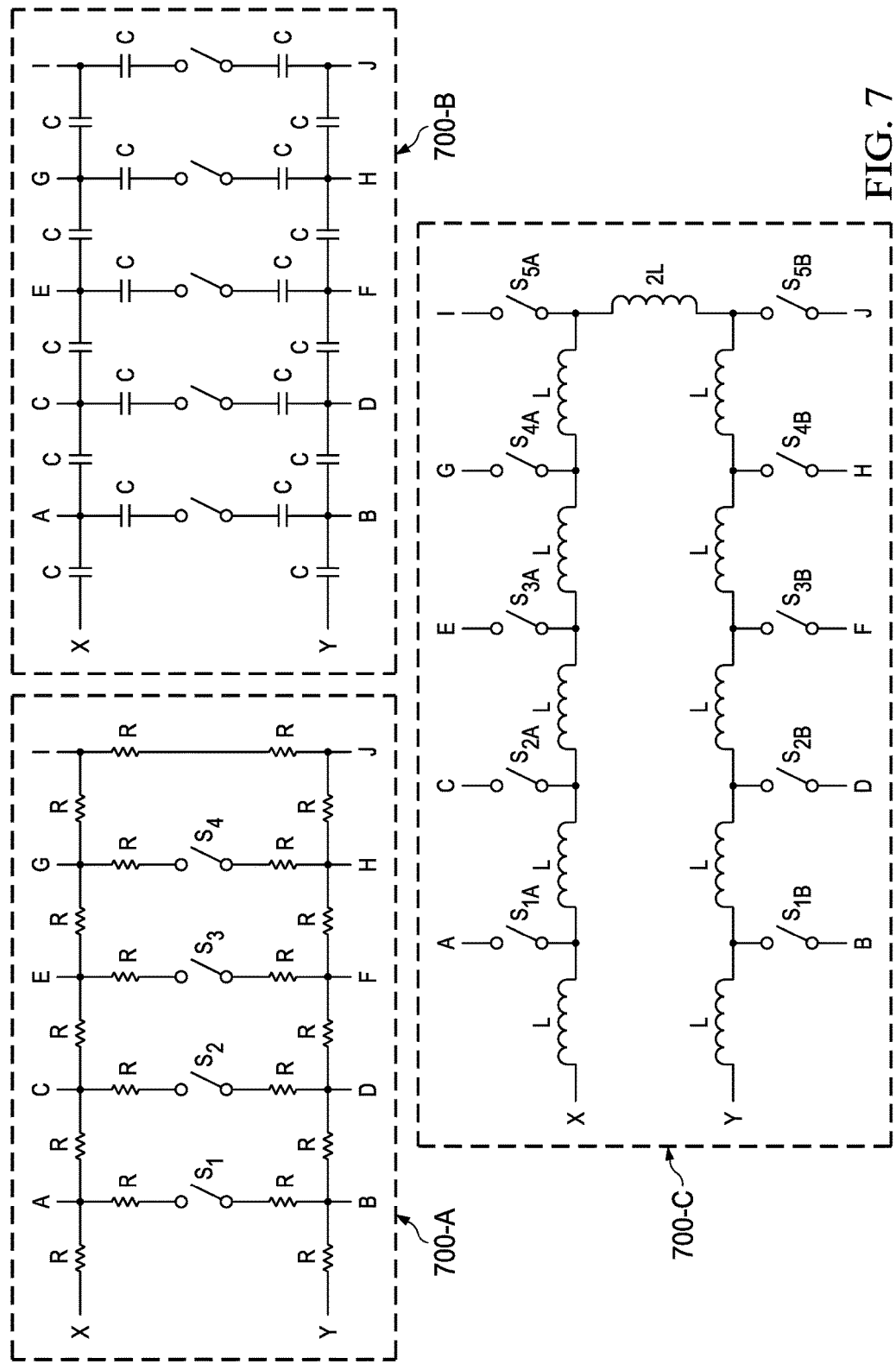
FIG. 7 is a schematic diagram of scalar elements for generating trigonometric weightage for a vector modulator in accordance with example embodiments.

FIG. 7 is a schematic diagram of scalar elements for generating trigonometric weightage for a vector modulator in accordance with example embodiments. Passive components (e.g., resistors R and capacitors C) are arranged in a ladder configuration, such that unit elements are used and tapped at intermediate points (taps A, B, C, D, E, F, G, H, I, and J) to implement the weight factors. For example, ladders 700-A, 700-B, and 700-C are three embodiments for implementing trigonometric weighting. A differential input signal is coupled to (e.g., the left of) the passive chain formed by the ladder and a weighting is selected by closing (e.g., through software control of programmable switches (e.g., $S_{1A}$, $S_{1B}$, $S_{2A}$, $S_{2B}$, $S_{3A}$, $S_{3B}$, $S_{4A}$, $S_{4B}$, $S_{5A}$, and $S_{5B}$) and/or mask programming/rewiring of metal layers of an integrated circuit) a switch associated with a set of tapping points (e.g. {A,B}, {C,D}, {E,F}, {G,H}, and {I,J}, where more or less sets can be used). For example, two passive networks include similar type of elements (resistors or capacitors) serially arranged. The ratios $\alpha_k$ and $\beta_k$ for the k-th (e.g., a selected) transmitter element are determined by the ratio of the impedance presented by the selected tapping point (e.g., B, D, F, H, or J) to that of the total impedance of the passive impedance line (e.g., where the last tapping point is selected):

$$\{\alpha k, \beta k\}=Zr/Zt' \qquad \text{(Eq. 14)}$$

where Zr is the equivalent impedance at the selected tapping point, and Zt is the total impedance of the line. The impedance ratios are applicable to passive ladder networks including resistive, capacitive, and inductive elements serially arranged as the laddered elements.

Figure 8:
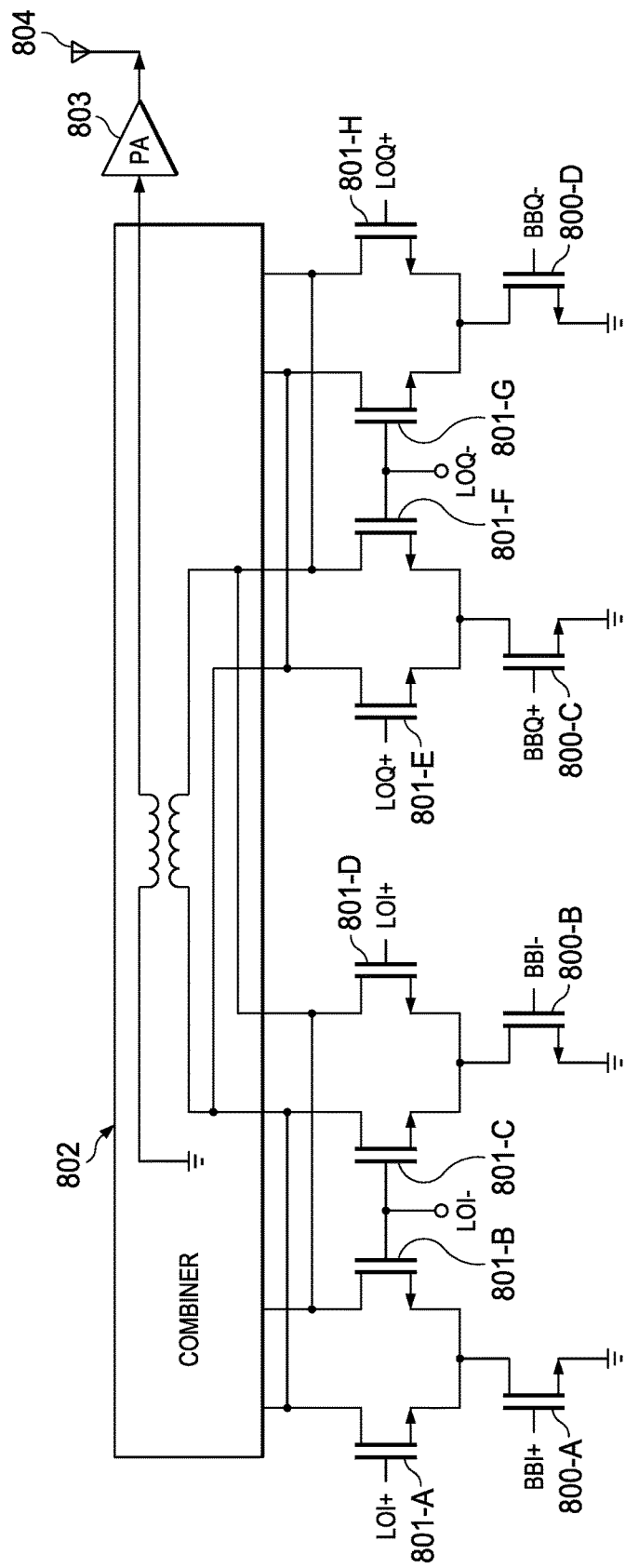
FIG. 8 is a schematic diagram of a one-local-oscillator up-conversion mixer in accordance with example embodiments.

FIG. 8 is a schematic diagram of a one-local-oscillator up-conversion mixer in accordance with example embodiments. Positive and negative quadratic baseband input signals for a selected transmitter element are coupled to a respective gate of first-level transistors 800-A, 800-B, 800-C, and 800-D for selectively sinking (e.g., grounding) a respective current signal. The output currents of first-level transistors 800-A, 800-B, 800-C, and 800-D are each dynamically controlled in response to the phases of respective differential quadrature signals applied to the gates of the second-level transistors (e.g., 801-A, 801-B, 801-C, 801-D, 801-E, 801-F, 801-G, and 801-H). The second-level transistors are controlled in response to a first local oscillator generating a first LO frequency in quadrature. The differential output currents generated by coupling the gates of commonly-gated transistors are combined to generate to a single-ended beamforming output voltage by a differential-to-single-ended conversion element (e.g., balun) 802. The conversion element (e.g., combiner) 802 is for coupling the single-ended beamforming output voltage to a single-ended power amplifier element 803 for transmission via transmitter element antenna 804 (e.g., of a phased array of antenna).

Accordingly, a beamforming (e.g., focusing) transmitter element output signal is generated in response to a first first-level transistor for sinking a first current signal in response to a positive in-phase baseband (BB) signal, a second first-level transistor for sinking a second current signal in response to a negative in-phase BB signal, a third first-level transistor for sinking third current signal in response to a positive quadrature-phase BB signal, and a fourth first-level transistor for sinking a fourth current signal in response to a negative quadrature-phase BB signal.

A first second-level transistor is arranged to control a first-direction output in response to a first positive in-phase local oscillator (LO) frequency and the first current signal. A second second-level transistor is arranged to control a second-direction output in response to a first negative in-phase LO frequency and the first current signal. A third second-level transistor is arranged to control the first-direction output in response to the first negative in-phase LO frequency and the second current signal. A fourth second-level transistor is arranged to control the second-direction output in response to the first positive in-phase LO frequency and the second current signal. A fifth second-level transistor is arranged to control the first-direction output in response to a first positive quadrature-phase LO frequency and the third current signal. A sixth second-level transistor is arranged to control the second-direction output in response to a first negative quadrature-phase LO frequency and the third current signal. A seventh second-level transistor is arranged to control the first-direction output in response to the first negative quadrature-phase LO frequency and the fourth current signal. An eighth second-level transistor is arranged to control the second-direction output in response to the first positive quadrature-phase LO frequency and the fourth current signal.

An output combiner is arranged to generate the beam-focusing transmitter element output signal in response to the first-direction output signal and the second-direction output signal. An amplifier is arranged to amplify the beam-focusing transmitter element output signal for transmission by a transmitter element antenna. Optionally, the amplifier and the combiner can be combined.

Figure 9:
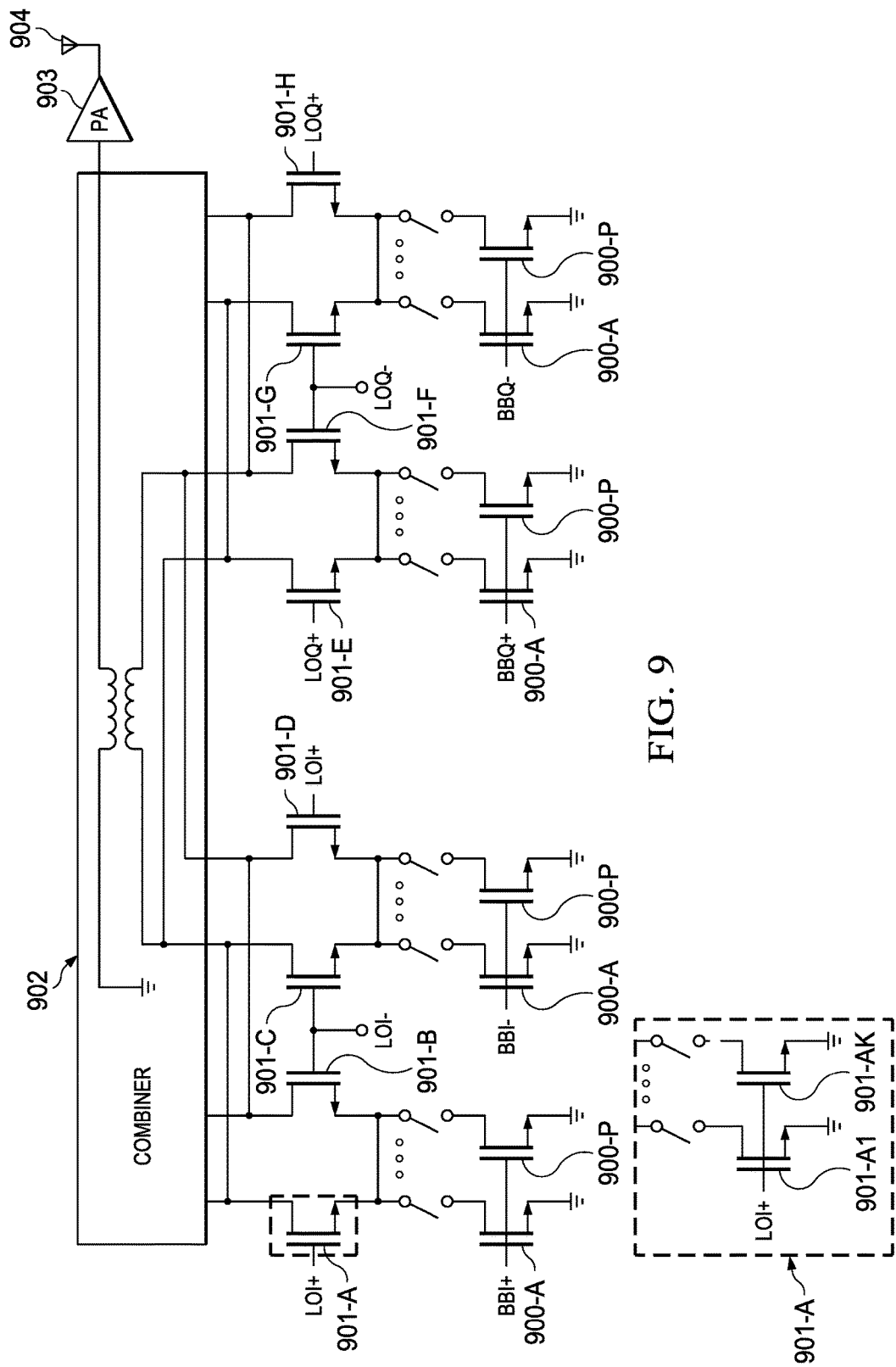
FIG. 9 is a schematic diagram of a one-local-oscillator up-conversion mixer including programmable segmented transistors in accordance with example embodiments.

FIG. 9 is a schematic diagram of a one-local-oscillator up-conversion mixer including programmable segmented transistors in accordance with example embodiments. Positive and negative quadratic baseband input signals for a selected transmitter element are coupled to a respective gate of first-level transistors 900-A, 900-B, 900-C, and 900-D for selectively sinking (e.g., grounding) a respective current signal. The respective output currents of first-level transistors 900-A, 900-B, 900-C, and 900-D are individually and dynamically controlled in response to the phases of respective differential quadrature signals applied to the gates of the second-level transistors (e.g., 901-A, 901-B, 901-C, 901-D, 901-E, 901-F, 901-G, and 901-H). The second-level transistors are controlled in response to a first local oscillator generating a first LO frequency in positive and negative quadrature. The differential output currents generated by coupling the gates of commonly-gated transistors are converted to a single-ended voltage by using a differential-to-single-ended conversion element (e.g., balun) 902, for coupling to a single-ended power amplifier element 903 for transmission via transmitter element antenna 904 (e.g., of a phased array of antenna).

Each of the second-level transistors (e.g., 901-A, 901-B, 901-C, 901-D, 901-E, 901-F, 901-G, and 901-H) is a "segmented" transistor in which "segments" (e.g., paralleled transistors having differing sized channels and/or transconductances) carry portions of an entire current in parallel. For example, transistor 901-A is shown as a series of transistor segments 901-A1 through 901-AK, where "K" is the number of segments used to form the entire transistor 901-A. Each segment is selected via mask programming (which forms wired connections to selected transistor segments 901-A1 through 901-AK) or switches (which form programmably selected connections to selected transistor segments 901-A1 through 901-AK). In similar fashion, transistors 900 are segmented as transistor segments 900-A through 900-P, where "P" is the number of segments used to form the entire transistor 900, and where each segment is selectively coupled using programmable switches or mask programming.

The trigonometrical weights ($\alpha, \beta$) are implemented by selecting various segments of each second-level segmented transistor (e.g., 901-A1 through 901-AK) and first-level segmented transistor (where each instance of segmented transistor 900 includes 900A-900P). Accordingly, particular trigonometric weights (e.g., for operating at a specific frequency) are programmably selected (e.g., such that a unitary system design/chip can be reused for operating efficiently in various allocated frequency "spectrum"). The balun element 902 converts differential signal to a single ended signal and the power amplifier element 903 amplifies the single ended signal and provides output to the transmitter element antenna 904. Each of the second-level transistors (e.g., 901-A, 901-B, 901-C, 901-D, 901-E, 901-F, 901-G, and 901-H) is independently weighted (e.g., scaled) with trigonometric weights independently of any other second-level transistor.

Accordingly, the first current signal (described above with respect to FIG. 8) is generated in response to a first trigonometric weight, the second current signal is generated in response to a second trigonometric weight, third current signal is generated in response to a third trigonometric weight, and the fourth current signal is generated in response to a fourth trigonometric weight, wherein the first, second, third, and fourth trigonometric weights are individually selectable.

Figure 10:
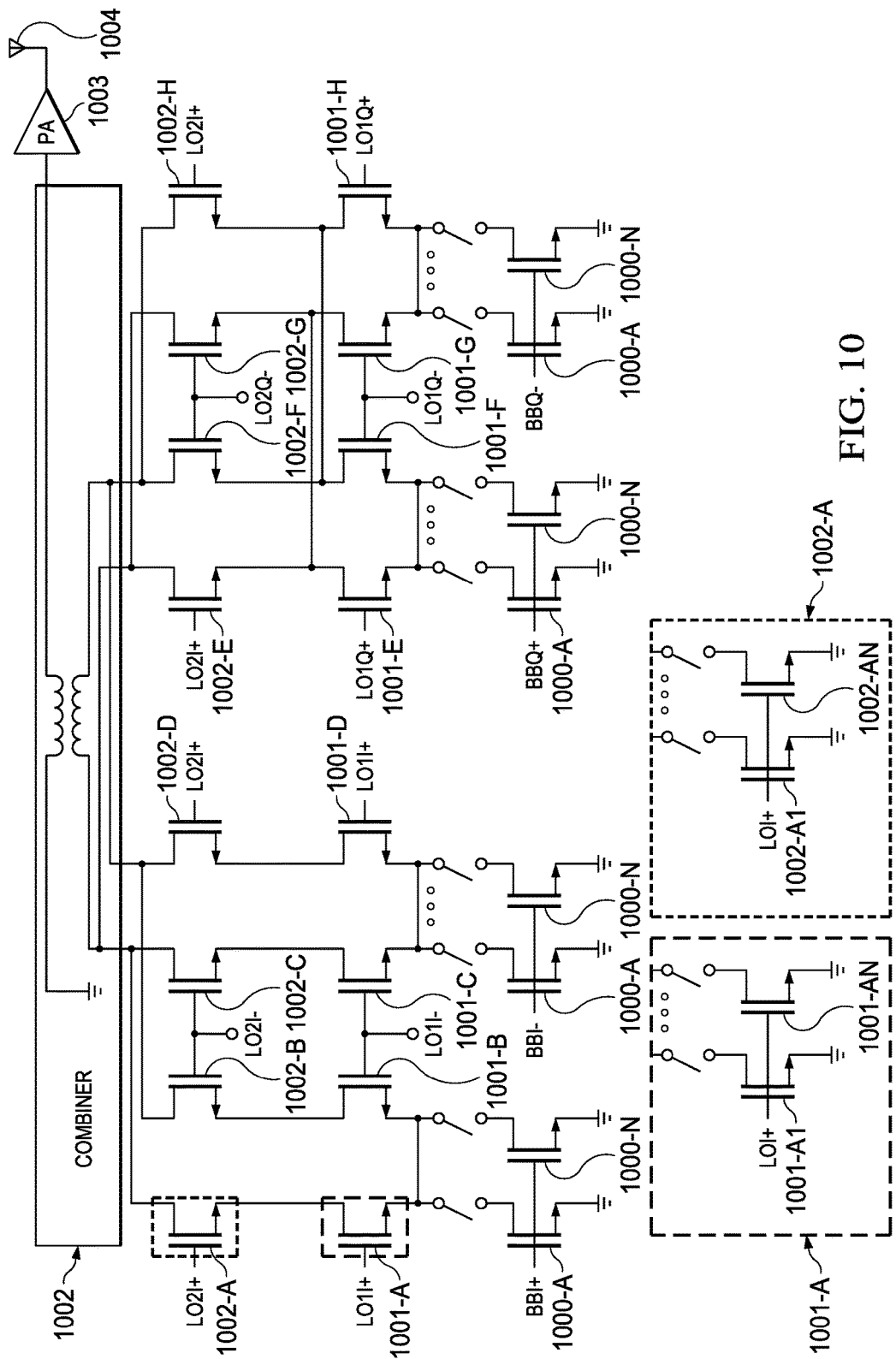
FIG. 10 is a schematic diagram of a two-local-oscillator up-conversion mixer in accordance with example embodiments.

FIG. 10 is a schematic diagram of a two-local-oscillator up-conversion mixer in accordance with example embodiments. Positive and negative quadratic baseband input signals for a selected transmitter element are coupled to a respective gate of first-level transistors 1000-A, 1000-B, 1000-C, and 1000-D for selectively sinking (e.g., grounding) a respective current signal. The respective output currents of first-level transistors 1000-A, 1000-B, 1000-C, and 1000-D are individually and dynamically controlled in response to the phases of respective differential quadrature signals applied to the gates of the second-level transistors (e.g., 1001-A, 1001-B, 1001-C, 1001-D, 1001-E, 1001-F, 1001-G, and 1001-H). The second-level transistors are controlled in response to a first local oscillator generating a first LO frequency in positive and negative quadrature. A third level of transistors includes transistors (e.g., 1002-A, 1002-B, 1002-C, 1002-D, 1002-E, 1002-F, 1002-G, and 1002-H) respectively coupled in series with a respective first level transistor and are controlled in response to a second local oscillator generating a second LO frequency in positive and negative quadrature.

The differential output currents generated by coupling the gates of commonly-gated transistors are converted to a single-ended voltage by using a differential-to-single-ended conversion element (e.g., balun) 1002, for coupling to a single-ended power amplifier element 1003 for transmission via transmitter element antenna 1004 (e.g., of a phased array of antenna).

Each of the second-level transistors (e.g., 1001-A, 1001-B, 1001-C, 1001-D, 1001-E, 1001-F, 1001-G, and 1001-H) is a segmented transistor. For example, transistor 1001-A is shown as a series of transistor segments 1001-A1 through 1001-AN, where "N" is the number of segments used to form the entire transistor 1001-A, where each segment is individually and selectively coupled using programmable switches or mask programming. Likewise, each of the third-level transistors s (e.g., 1002-A, 1002-B, 1002-C, 1002-D, 1002-E, 1002-F, 1002-G, and 1002-H) is a segmented transistor where, for example, transistor 1002-A is shown as a series of transistor segments 1002-A1 through 1002-AN, where "N" is the number of segments used to form the entire transistor 1002-A, and wherein each segment is individually and selectively coupled using programmable switches or mask programming. Similarly transistors 1000 are segmented as transistor segments 1000-A through 1000-N, where "N" is the number of segments used to form the entire transistor 1000, and where each segment is selectively coupled using programmable switches or mask programming.

A first set of trigonometrical weights ($\alpha, \beta$) are implemented by selecting various segments of each second-level segmented transistor (e.g., 1001-A1 through 1001-AK) and first-level segmented transistor (where each instance of segmented transistor 1000 includes 1000A-1000P). A second set of trigonometrical weights ($\alpha, \beta$) are implemented by selecting various segments of each third-level segmented transistor (e.g., 1002-A1 through 1002-AN) and first-level segmented transistor (where each instance of segmented transistor 1000 includes 1000A-1000N). Accordingly, particular trigonometric weights (e.g., for operating at a specific frequency) are programmably selected (e.g., such that a unitary system design/chip can be reused for operating efficiently in various allocated frequency "spectrum"). The balun element 1002 converts differential signal to a single ended signal and the power amplifier element 1003 amplifies the single ended signal and provides output to the transmitter element antenna 1004. Each of the third-level transistors (e.g., 1002-A, 1002-B, 1002-C, 1002-D, 1002-E, 1002-F, 1002-G, and 1002-H) is independently weighted (e.g., scaled) with trigonometric weights independently of any other third-level transistor.

Accordingly, a first third-level transistor is arranged to control the first-direction output (with reference to the discussion above with respect to FIG. 8) in response to a second positive in-phase local oscillator (LO) frequency and the first current signal. A second third-level transistor is arranged to control the second-direction output in response to a second negative in-phase LO frequency and the first current signal. A third third-level transistor is arranged to control the first-direction output in response to the second negative in-phase LO frequency and the second current signal. A fourth third-level transistor is arranged to control the second-direction output in response to the second positive in-phase LO frequency and the second current signal. A fifth third-level transistor is arranged to control the first-direction output in response to a second positive quadrature-phase LO frequency and the third current signal. A sixth third-level transistor is arranged to control the second-direction output in response to a second negative quadrature-phase LO frequency and the third current signal. A seventh third-level transistor is arranged to control the first-direction output in response to the second negative quadrature-phase LO frequency and the fourth current signal. An eighth third-level transistor is arranged to control the second-direction output in response to the second positive quadrature-phase LO frequency and the fourth current signal.

Figure 11:
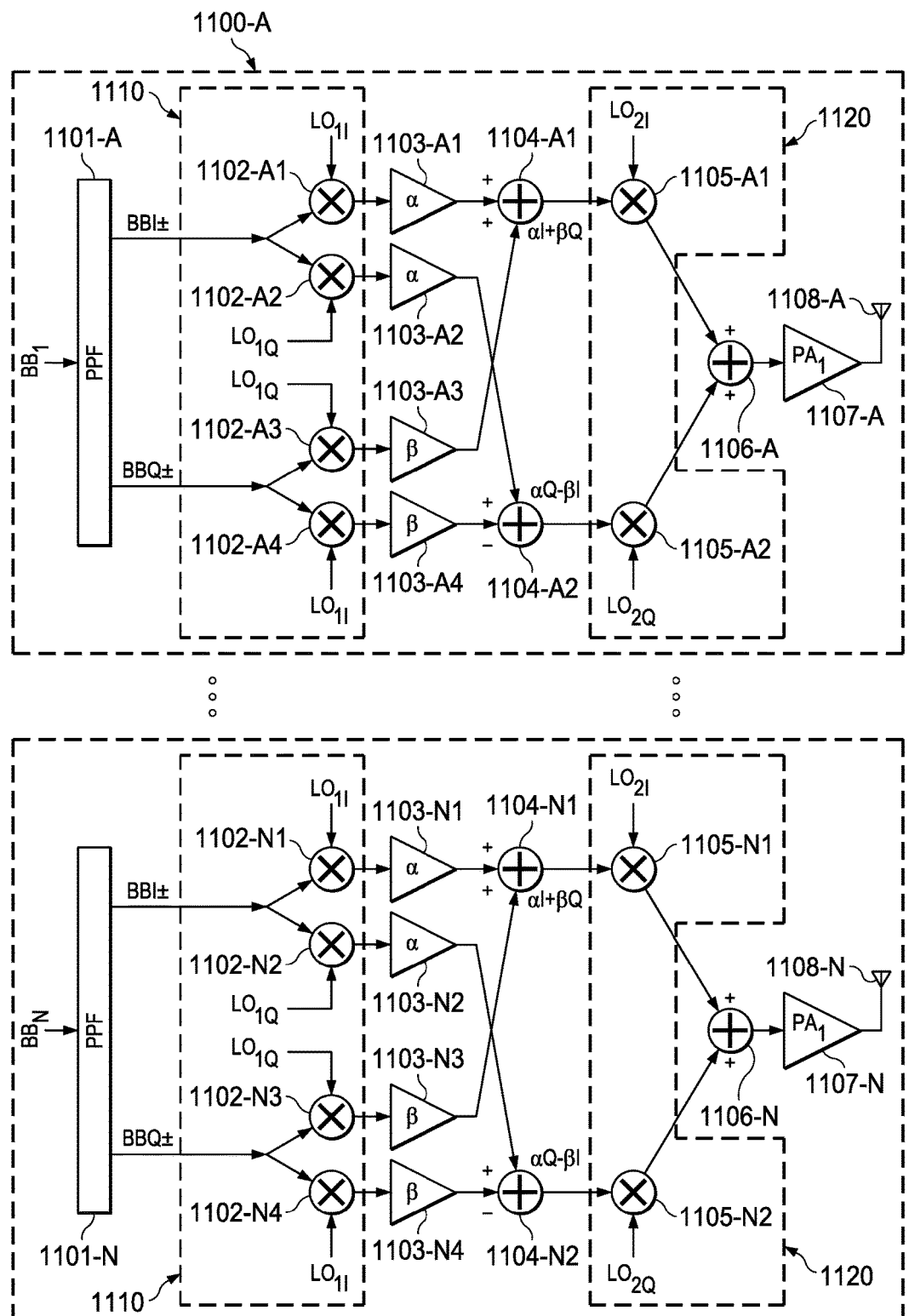
FIG. 11 is a schematic diagram of a transmitter elements for intermediate frequency-level trigonometric weighting in accordance with example embodiments.

FIG. 11 is a schematic diagram of a transmitter elements for intermediate frequency-level trigonometric weighting in accordance with example embodiments. Each of the baseband signals (e.g., $BB_1$ to $BB_N$) is coupled to a respective polyphase phase shifter network (e.g., PPF 1101-A through 1101-N). The baseband-filtered quadrature differential outputs from the PPF 1101 are coupled to a first stage 1110 of quadrature mixers (e.g., 1102-A1, -A2, -A3, -A4 to 1102-N1, -N2, -N3, -N4). The first stage 1110 of quadrature mixers is arranged to up-convert the baseband-filtered quadrature differential signals from the PPF 1101. For example, mixer 1102-A1 is arranged to up-convert a filtered in-phase baseband signal in response to an in-phase LO (e.g., $LO_{1I}$) signal for generating a first once-modulated in-phase signal. Mixer 1102-A2 is arranged to up-convert a filtered in-phase baseband signal in response to a quadrature-phase LO (e.g., $LO_{1Q}$) signal for generating a second once-modulated in-phase signal. Mixer 1102-A3 is arranged to up-convert a filtered quadrature-phase baseband signal in response to a quadrature-phase LO (e.g., $LO_{1Q}$) signal for generating a first once-modulated quadrature-phase signal. Mixer 1102-A4 is arranged to up-convert a filtered quadrature-phase baseband signal in response to an in-phase LO (e.g., $LO_{1I}$) signal for generating a second once-modulated quadrature-phase signal.

The outputs (the C) from the first stage 1110 of quadrature mixers are coupled to respective trigonometric weights scaling elements (e.g., 1103-A1, -A2, -A3, -A4 to 1103-N1, -N2, -N3, -N4) to generate post-first stage trigonometrically weighted signals (first and second once-modulated in-phase trigonometrically weighted signals, and first and second once-modulated quadrature-phase trigonometrically weighted signals). The trigonometric scaling factors at IF frequency (e.g., 1103-A1, -A2, -A3, -A4 to 1103-N1, -N2, -N3, -N4) can be implemented using serial component(s) such as any combination of 700-A, 700-B and 700-C (although serial inductors can be cost-inefficient in many applications).

The post-first stage IF trigonometrically weighted signals output by the trigonometric scaling factor elements are coupled to the single-sideband combiner elements (e.g., summation elements 1104-A1, -A2 to 1104-N1, -N2). For example, LO combiner element 1104-A1 performs the operation $\alpha I + \beta Q$, whereas LO combiner element 1104-A2 performs the operation $\alpha Q - \beta I$. Combiner elements up though 1104-N1 and 1104-N2 perform similar operations, except using same or different values of $\alpha$ and $\beta$ for each transmitter element. Accordingly, the IF-level $\alpha I + \beta Q$ and $\alpha Q - \beta I$ signals are respectively weighted (in the IF domain by combiners such as 700-A, 700-B, and/or 700-C) in accordance with a first set of (IF) trigonometric weights $\alpha$ and $\beta$ for a particular transmitter element k. Optionally, the trigonometric weights scaling elements (e.g., 1103) and the combiner elements (e.g., 1104) can be combined.

The outputs ($\alpha I + \beta Q$ and $\alpha Q - \beta I$ signals) from the single-sideband combiner elements are provided to the second stage 1120 of mixer elements (e.g., 1105-A1, -A2 to 1105-N1, -N2) to generate twice-LO-modulated trigonometrically weighted $\alpha I + \beta Q$ and $\alpha Q - \beta I$ signals. The twice-LO-modulated once-trigonometrically-weighted signals $\alpha I + \beta Q$ and $\alpha Q - \beta I$ output from the second stage 1120 of mixers are coupled to the second sideband combiner element (1106-A through 1106-N) to generate RF-modulated (e.g., up-converted) combined $\alpha I + \beta Q + \alpha Q - \beta I$ signal. The combined $\alpha I + \beta Q + \alpha Q - \beta I$ signal is accordingly a pre-amplification trigonometrically-weighted signal.

Each of the pre-amplification trigonometrically-weighted signals for a particular transmitter element k is coupled to a respective power amplifier (e.g., one of 1107-A through 1107-N). After amplification, the amplified trigonometrically-weighted signals are transmitted (e.g., through the air) by physically separated antennas 1108-A through 1108-N (e.g., which are separated by a distance including a fraction of a wavelength of a transmission carrier frequency).

Figure 12:
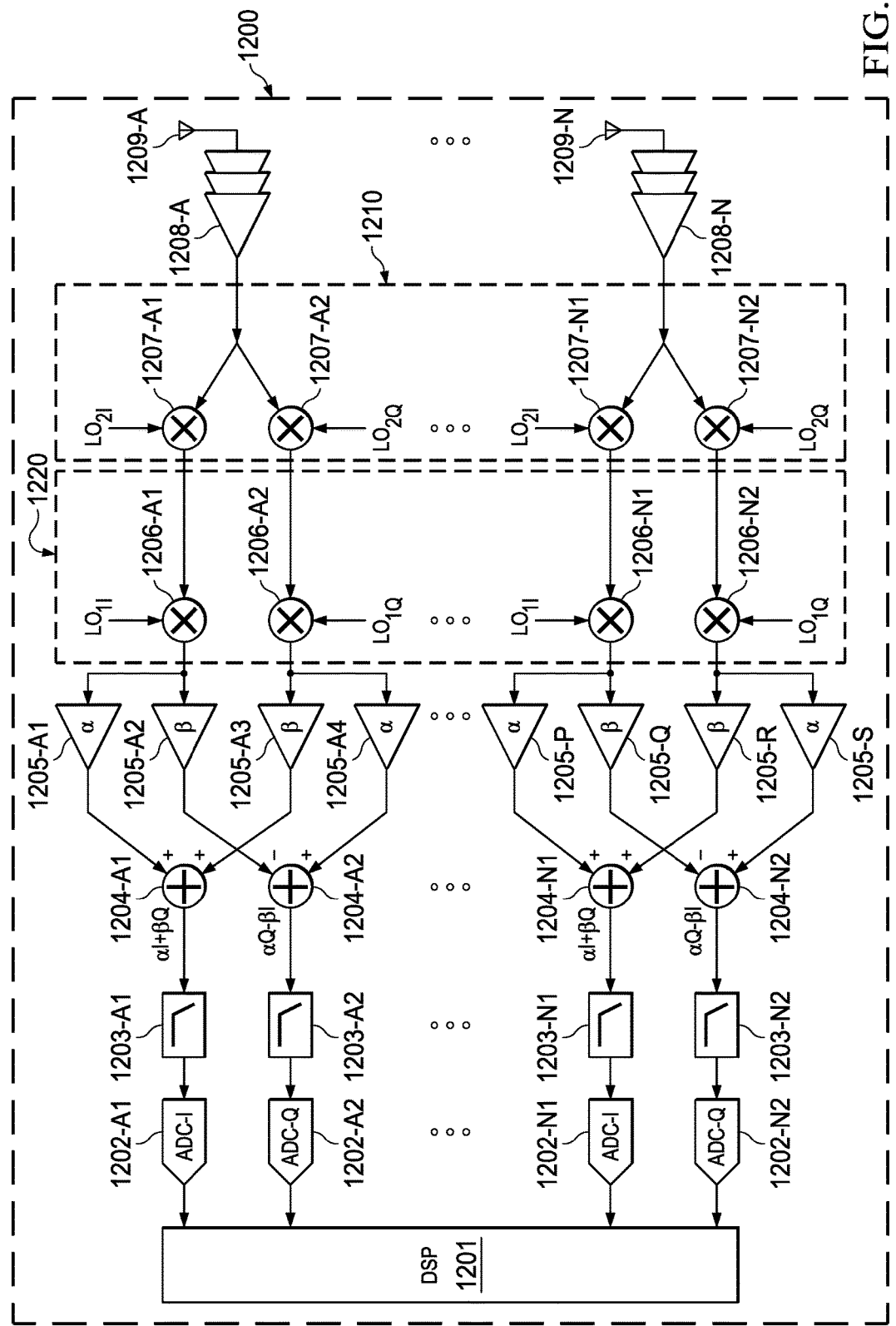
FIG. 12 is a schematic diagram of receiver elements for baseband trigonometric weighting in accordance with example embodiments.

FIG. 12 is a schematic diagram of receiver elements for baseband trigonometric weighting in accordance with example embodiments. Receiver array 1200 includes a number "N" of receiver elements working concurrently, where each receiver element receives an RF signal from a respective antenna (1209-A through 1209-N). More specifically, low noise amplifiers (LNAs 1208-A through 1208-N) are coupled to receive a signal (modulated on carrier wave) from a respective antenna 1209 in an antenna array.

The output of each LNA 1208 is coupled to a respective first stage 1210 of quadrature down-conversion mixers (e.g., 1207-A1, 1207-A2 to 1207-N1, 1207-N2). The first stage 1210 of quadrature down-conversion mixers is arranged to down-convert a received RF signal from an LNA 1208: The first stage 1210 of quadrature down-conversion mixers is arranged to down-convert a received RF signal from an LNA 1308: a first mixer 1207-A1 is coupled to a first in-phase LO (e.g., $LO_{2I}$) signal for generating a first once-demodulated signal; and a second mixer 1207-A2 is coupled to a first quadrature-phase LO (e.g., $LO_{2Q}$) signal for generating a second once-demodulated signal.

The outputs (first and second once-demodulated signals) of the first stage 1210 of quadrature down-conversion mixers (e.g., the first and second once-demodulated IF signals) are coupled to the second stage 1220 of quadrature down-conversion mixers (e.g., 1206-A1, 1206-A2 to 1206-N1, 1206-N2). The second stage 1220 of quadrature down-conversion mixers is arranged to down-convert the first and second once-demodulated signal signals: a first mixer 1206-A1 is coupled to a second in-phase LO (e.g., $LO_{1I}$) signal for generating a first twice-demodulated signal; and a second mixer 1206-A2 is coupled to a second quadrature-phase LO (e.g., $LO_{IQ}$) signal for generating a second twice-demodulated signal.

The outputs (e.g., the first and second twice-demodulated signals) of the second stage 1220 of quadrature down-conversion mixers are coupled to a respective trigonometric scaling factor element (e.g., one of 1205-A1, -A2, -A3, -A4 to 1205-N1, -N2, -N3, -N4), where each trigonometric scaling factor element is a combiner such as combiner 700-A or 700-B. For example, a first trigonometric scaling factor element 1205-A1 is arranged to scale the first twice-demodulated signal in accordance with a selected α (where an α of another receiver element can have a different selected value of α) to generate an α-scaled in-phase signal (signal αI), a second trigonometric scaling factor element 1205-A2 is arranged to scale the first twice-demodulated signal in accordance with a selected β (where a β of another receiver element can have a different selected value of β) to generate a β-scaled in-phase signal (signal βI), a third trigonometric scaling factor element 1205-A3 is arranged to scale the second twice-demodulated signal in accordance with the selected β to generate a β-scaled quadrature-phase signal (signal βQ), and a fourth trigonometric scaling factor element 1205-A4 is arranged to scale the second twice-demodulated signal in accordance with the selected α to generate an α-scaled quadrature-phase signal (signal αQ).

Outputs (signals αI, βI, βQ, and αQ) from the trigonometric scaling factor elements 1204 are coupled to a single sideband combiner 1204 (e.g., 1204-A1, -A2 to 1204-N1, -N2). For example, combiner 1204-A1 is arranged to generate signal αI+βQ in response to signals αI and βQ, and combiner 1204-A2 is arrange to generate signal αQ−βI in response to signals αQ and βI.

The outputs (signals αI+βQ and αQ−βI) from the single sideband combiner 1204 are coupled to a pair 1203 of low-pass baseband filters (e.g., 1203-A1, -A2 to 1203-N1, -N2). For example, the low-pass baseband filter 1203-A1 is arranged to generate a filtered αI+βQ signal in response to the αI+βQ signal, and the low-pass baseband filter 1203-A2 is arranged to generate a filtered αQ−βI signal in response to the αQ−βI signal.

The outputs (the filtered αI+βQ signal and the filtered αQ−βI signal) from the pair 1203 of low-pass baseband filters are coupled to a pair 1202 of analog to digital converters (e.g., ADCs 1202-A1, -A2 to 1202-N1, -N2) for digitizing the received input signals and generating a digital bit stream for each ADC 1202 (for generating in-phase and quadrature-phase digital signals). The digital outputs from all ADCs are coupled to the digital signal processor (DSP) 1201. Accordingly, each of the receiver elements in receiver 1200 uses a (e.g., potentially) different trigonometric scaling factor value between adjacent receiver elements to implement a phase shift of 180/N between signals received from adjacent antenna structures 1209. Further, each of the bit streams includes an output information signal, which includes information from the input information signal generated by a respective antenna.

The DSP 1201 is arranged to program and control any programmable component (such as digitally controlled switches) or programmable function of the receiver array 1200 and optionally any programmable component/function of a transmitter element, for example when the receiver array 1200 is part of a transceiver system. For example, the DSP is arranged to control functions such as filtering, phase shifting, trigonometric weighting and beamforming, upper or lower sideband injection selection, second mixing stage bypass, multiplier and divisor values for the multiplication-level operation unit of the programmable local oscillator, controlling transconductance and current density of transistors through selection of transistor segments in various mixers.

Figure 13:
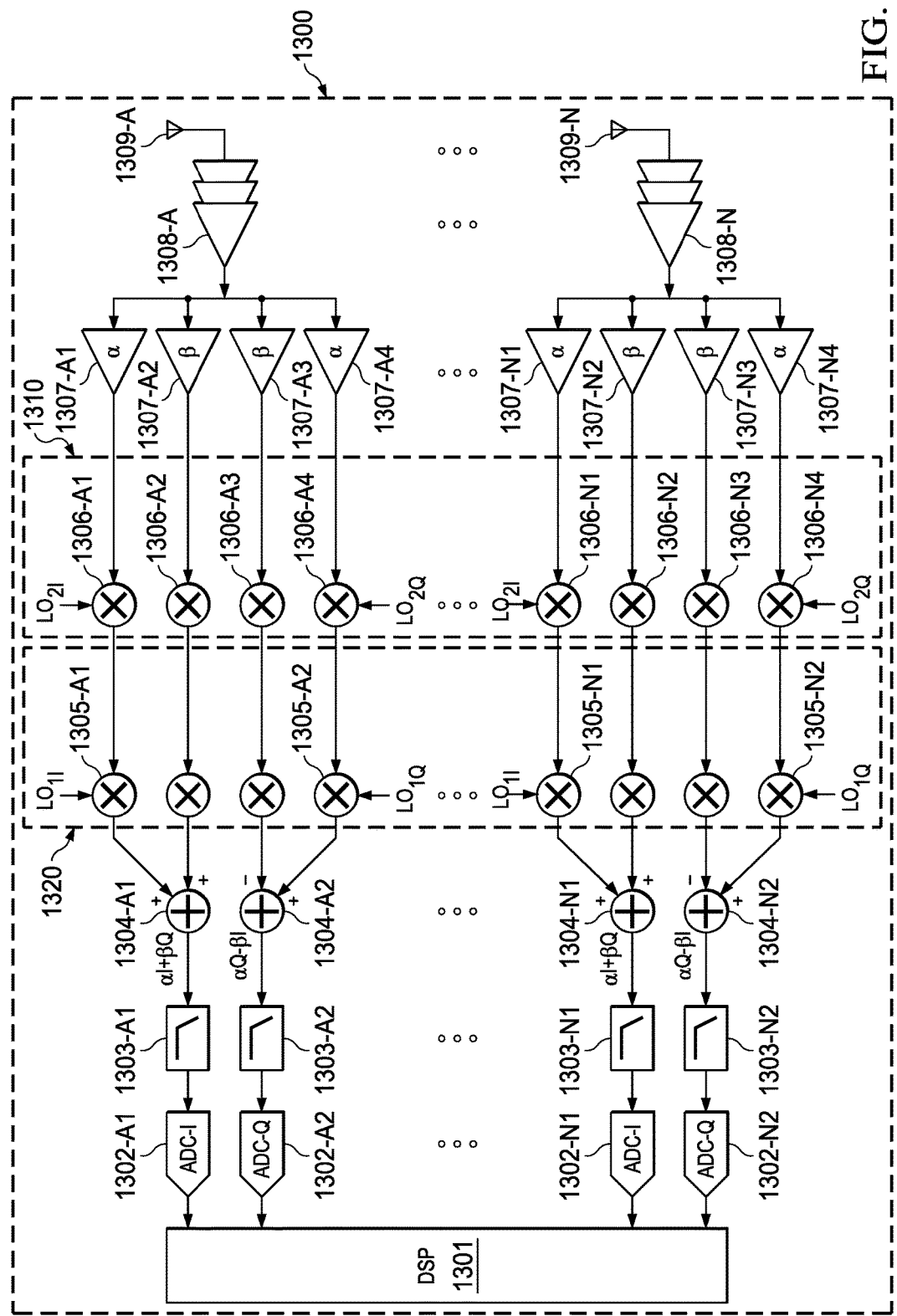
FIG. 13 is a schematic diagram of receiver elements for radio frequency trigonometric weighting in accordance with example embodiments.

FIG. 13 is a schematic diagram of receiver elements for radio frequency trigonometric weighting in accordance with example embodiments. Receiver array 1300 includes a number "N" of receiver elements working concurrently, where each receiver element receives an RF signal from a respective antenna (1309-A through 1309-N). More specifically, low noise amplifiers (LNAs 1308-A through 1308-N) of an element are coupled to receive a signal (modulated on carrier wave) from a respective antenna 1309 in an antenna array.

The output of each LNA 1308 is coupled to a respective trigonometric scaling factor element (e.g., 1307-A1, -A2, -A3, -A4 to 1307-N1, -N2, -N3, -N4), where each trigonometric scaling factor element is a combiner such as combiner 700-A or 700-B. For example, a first trigonometric scaling factor element 1307-A1 is arranged to scale the received signal in accordance with a selected α (where an a of another receiver element can have a different selected value of a) to generate a first α-scaled received signal, a second trigonometric scaling factor element 1307-A2 is arranged to scale the received signal in accordance with a selected β (where a β of another receiver element can have a different selected value of β) to generate a first β-scaled received signal, a third trigonometric scaling factor element 1307-A3 is arranged to scale the received signal in accordance with the selected β to generate a second β-scaled received signal, and a fourth trigonometric scaling factor element 1307-A4 is arranged to scale the received signal in accordance with the selected α to generate a second α-scaled received signal.

Outputs (the first α-scaled signal, the first β-scaled signal, the second β-scaled signal, and the second α-scaled signal) from the trigonometric scaling factor elements 1306 are coupled to respective quadrature down-conversion mixers (e.g., 1306-A1, 1306-A2, 1306-A3, 1306-A4 to 1306-N1, 1306-N2, 1306-N3, 1306-N4) of the first stage 1310. The first stage 1310 of quadrature down-conversion mixers is arranged to down-convert a received RF signal from an LNA 1308: a first mixer 1306-A1 is coupled to a first in-phase LO (e.g., $LO_{2I}$) signal for generating a first once-demodulated trigonometrically weighted signal; and a second mixer 1306-A2 is coupled to a first quadrature-phase LO (e.g., $LO_{2Q}$) signal for generating a second once-demodulated trigonometrically weighted signal.

The outputs (first and second once-demodulated trigonometrically weighted signals) of the first stage 1310 of quadrature down-conversion mixers are coupled to the second stage 1320 of quadrature down-conversion mixers (e.g., 1305-A1, 1305-A2 to 1305-N1, 1305-N2). The second stage 1320 of quadrature down-conversion mixers is arranged to down-convert first and second once-demodulated trigonometrically weighted signal signals: a first mixer 1305-A1 is coupled to a second in-phase LO (e.g., $LO_{1I}$) signal for generating a first twice-demodulated trigonometrically weighted signal; and a second mixer 1305-A2 is coupled to a second quadrature-phase LO (e.g., $LO_{1Q}$) signal for generating a second twice-demodulated trigonometrically weighted signal.

The outputs (first and second twice-demodulated trigonometrically weighted signals) of the second stage 1320 of quadrature down-conversion mixers are coupled to a single sideband combiner 1304 (e.g., 1304-A1, -A2 to 1304-N1, -N2). For example, combiner 1304-A1 is arranged to generate signal $\alpha I+\beta Q$ in response to signals $\alpha I$ and $\beta Q$, and combiner 1304-A2 is arrange to generate signal $\alpha Q-\beta I$ in response to signals $\alpha Q$ and $\beta I$.

The outputs (signals $\alpha I+\beta Q$ and $\alpha Q-\beta I$) from the single sideband combiner 1304 are coupled to a pair 1303 of low-pass baseband filters (e.g., 1303-A1, -A2 to 1303-N1, -N2). For example, the low-pass baseband filter 1303-A1 is arranged to generate a filtered $\alpha I+\beta Q$ signal in response to the $\alpha I+\beta Q$ signal, and the low-pass baseband filter 1303-A2 is arranged to generate a filtered $\alpha Q-\beta I$ signal in response to the $\alpha Q-\beta I$ signal.

The outputs (the filtered $\alpha I+\beta Q$ signal and the filtered $\alpha Q-\beta I$ signal) from the pair 1303 of low-pass baseband filters are coupled to a pair 1302 of analog to digital converters (e.g., ADCs 1302-A1, -A2 to 1302-N1, -N2) for digitizing the received input signals and generating a digital bit stream for each ADC 1302 (for generating in-phase and quadrature-phase digital signals). The digital outputs from all ADCs are coupled to the digital signal processor (DSP) 1301. Accordingly, each of the receiver elements in receiver 1300 uses (e.g., slightly) different trigonometric scaling factor values between adjacent receiver elements to phase shift signals received from adjacent antenna structures 1309, where the adjacently received (e.g., by adjacent receiver elements) signals by $180/N$.

Figure 14:
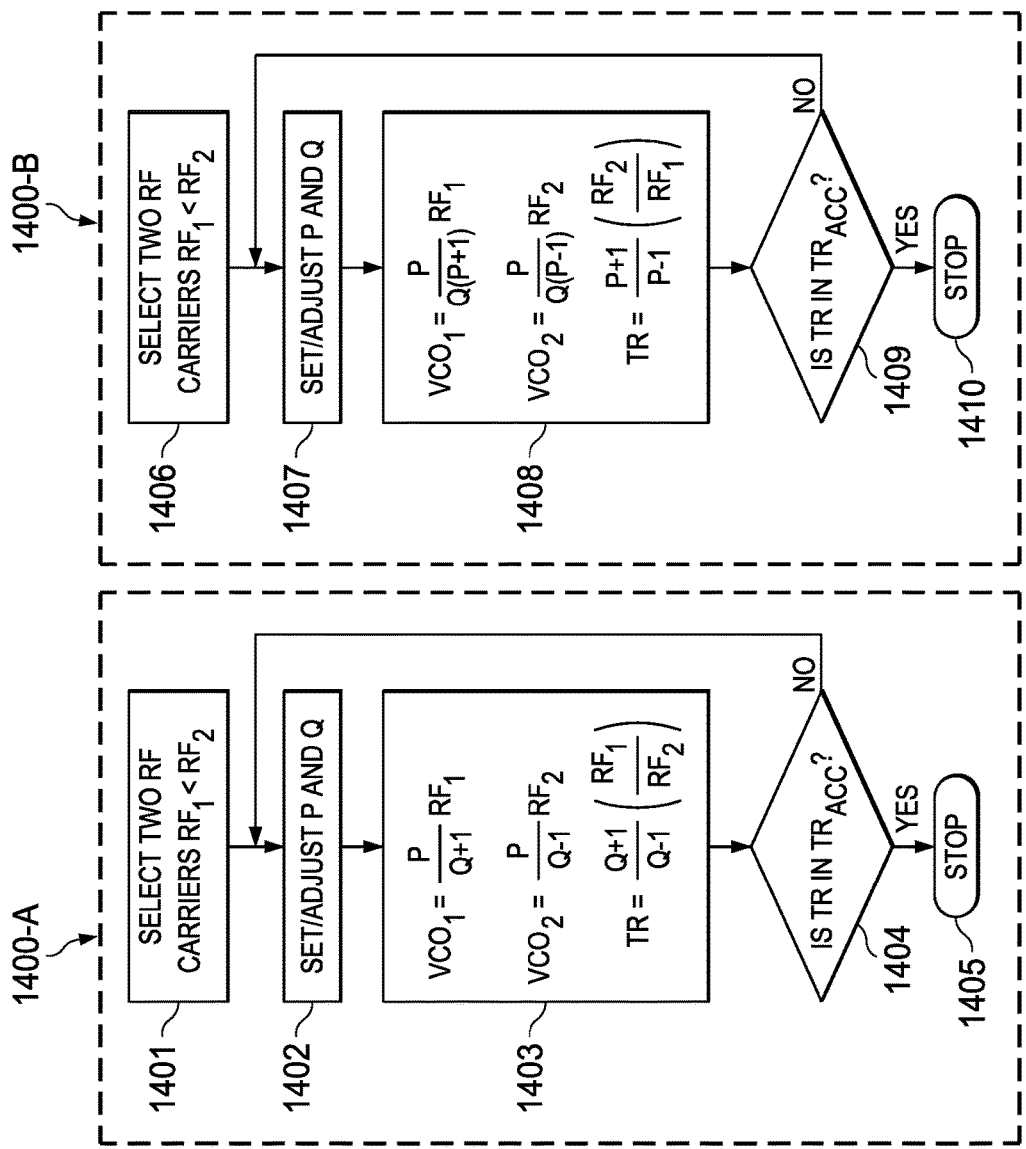
FIG. 14 is a flow diagram for selection of values for first and second multiplication-order operations for a local oscillator in accordance with example embodiments.

FIG. 14 is a flow diagram for selection of values for first and second multiplication-order operations for a local oscillator in accordance with example embodiments. In a first embodiment program flow 1400-A, for example, values of P and Q are selected in accordance with two step up mixing used for transmitting (or step down is used for receiving) where tandem multiplication-order operation units are arranged in a divide-first-then-multiply configuration using a first even order divider (/P) including and output coupled to a second odd-order multiplier (XQ).

In operation 1401, two center frequencies of RF carriers are selected as $RF_1$ and $RF_2$, with the initial constraint of $RF_1 < RF_2$. For example, when $RF_1 = 28$ GHz and $RF_2 = 35$ GHz, the two center frequencies of 28 GHz and 35 GHz are accordingly targeted as RF carrier frequencies.

In operation 1402, an initial value for each of P and Q are determined. For example, the values of each of P and Q can be determined by selecting and/or adjusting each value over a relatively limited number of iterations of operations 1402, 1403, and 1404.

In operation 1403, corresponding VCO frequencies $VCO_1$ and $VCO_2$ and a tuning range TR are determined. For example, VCO frequencies $VCO_1$ and $VCO_2$ are determined in accordance with the equations $$VCO_1 = \frac{P}{Q+1} RF1$$

and $$VCO_2 = \frac{P}{Q-1} RF2$$

and the effective tuning range is determined in accordance with the equation $$TR = \frac{Q+1}{Q-1}\left(\frac{RF2}{RF1}\right).$$

In operation 1404, a decision is made as to whether the tuning range TR is within an acceptable tuning range ($TR_{ACC}$). For example, the acceptable tuning range is the tuning range over which a selected VCO operates within parameters selected for a particular application. When the current values for P and Q do not acceptably fall within the tuning range, program flow proceeds to operation 1402, where a (e.g., further) adjustment in P and Q is made such that individual values of P and Q satisfying the acceptable tuning range are converged upon. When the current values for P and Q acceptably fall within the tuning range, program flow proceeds to terminus 1405, where the determined values of P and Q are retained and subsequently used to program a local oscillator (such as 500-A and 500-B).

In a second embodiment program flow 1400-B, similar steps to program flow 1400-A are executed. For example, values of Q and P are selected in accordance with two step up mixing used for transmitting (or step down is used for receiving) where tandem multiplication-order operation units are arranged in a multiply-first-then-divide configuration using a first odd-order multiplier (XQ) including an output coupled to a second even order divider (/P).

In operation 1406, two center frequencies of RF carriers are selected as $RF_1$ and $RF_2$, with the initial constraint of $RF_1 < RF_2$. For example, when $RF_1 = 28$ GHz and $RF_2 = 35$ GHz, the two center frequencies of 28 GHz and 35 GHz are accordingly targeted as RF carrier frequencies.

In operation 1407, an initial value for each of P and Q are determined. For example, the values of each of P and Q can be determined by selecting and/or adjusting each value over a relatively limited number of iterations of operations 1407, 1408, and 1409.

In operation 1408, corresponding VCO frequencies $VCO_1$ and $VCO_2$ and a tuning range TR are determined. For example, VCO frequencies $VCO_1$ and $VCO_2$ are determined in accordance with the equations $$\left(VCO_1 = \frac{P}{Q(P+1)} RF1\right)$$

and $$VCO_2 = \frac{P}{Q(P-1)} RF2,$$

the effective tuning range is determined in accordance with the equation using $$TR = \frac{P+1}{P-1}\left(\frac{RF2}{RF1}\right).$$

In operation 1409, a decision is made as to whether the tuning range TR is within an acceptable tuning range ($TR_{ACC}$). For example, the acceptable tuning range is the tuning range over which a selected VCO operates within parameters selected for a particular application. When the current values for P and Q do not acceptably fall within the tuning range, program flow proceeds to operation 1402, where a (e.g., further) adjustment in Q and P is made such that individual values of Q and P satisfying the acceptable tuning range are converged upon. When the current values for Q and P acceptably fall within the tuning range, program flow proceeds to terminus 1405, where the determined values of Q and P are retained and subsequently used to program a local oscillator (such as 500-A and 500-B).

What is claimed is:

1. A circuit, comprising:
   a multiplication-order operation unit for receiving a master frequency signal, for generating a first derived frequency signal in response to the master frequency signal in accordance with a first multiplication-order operation, and for generating a second derived frequency signal in response to the first derived frequency signal in accordance with a second multiplication-order operation, wherein the second multiplication-order operation is a multiplication-order operation that is inverse to the first multiplication-order operation;
   a first mixer stage for mixing in quadrature an input information signal in response to the first derived frequency signal to generate a first mixer stage output signal including components of the first derived frequency signal;
   a trigonometric weighting scaler for trigonometrically scaling the input information signal in response to a trigonometric weight to generate a scaler output signal including components of the trigonometric weight;
   a second mixer stage for mixing in quadrature the input information signal in response to the second derived frequency signal to generate a second mixer stage output signal including components of the second derived frequency signal; and
   an output combiner for generating an output information signal, wherein the output information signal includes components of the first mixer stage output signal, the scaler output signal, and the second mixer stage output signal.

2. The circuit of claim 1, wherein the input information signal is received via either an antenna or a digital-to-analog converter (DAC).

3. The circuit of claim 1, wherein the second mixer stage output signal is generated in response to the first mixer stage output signal.

4. The circuit of claim 1, wherein the first and second mixer stage are arranged to mix in quadrature in accordance with either a modulation operation or a demodulation operation.

5. The circuit of claim 1, wherein the first and second mixer stage are arranged to mix in quadrature in accordance with: $\cos(\omega_{LO1}+\omega_{LO2}+\omega_{BB})t = \cos(\omega_{LO1}t)\cos(\omega_{LO2}t)\cos(\omega_{BB}t) - \sin(\omega_{LO1}t)\sin(\omega_{LO2}t)\cos(\omega_{BB}t) - \sin(\omega_{LO1}t)\cos(\omega_{LO2}t)\sin(\omega_{BB}t) - \cos(\omega_{LO1}t)\sin(\omega_{LO2}t)\sin(\omega_{BB}t)$, where ti is time, $\omega_{LO1}$ is the first derived frequency signal in quadrature input signal having a frequency higher than a baseband frequency, $\omega_{LO2}$ is the second derived frequency signal in quadrature input signal and $\omega_{BB}$ is the information signal in quadrature at the baseband frequency.

6. The circuit of claim 1, wherein the output combiner is arranged to combine components of the first mixer stage output signal and the second mixer stage output signal in accordance with a current mode of operation.

7. The circuit of claim 1, comprising a sideband combiner arranged to generate a single sideband output information signal in response to the second mixer stage output signal.

8. The circuit of claim 1, wherein the trigonometric weighting scaler is arranged to selectively phase shift the output information signal.

9. The circuit of claim 1, wherein the first multiplication-order operation is executed by converting energy from fundamental frequency to odd-order harmonics and wherein the second multiplication-order operation is executed by one or more divide-by-two digital dividers.

10. The circuit of claim 1, wherein the first multiplication-order operation and the second multiplication-order operation are programmable.

11. The circuit of claim 1, comprising a voltage controlled oscillator (VCO) for generating the master frequency signal operable at a frequency lower than a carrier frequency of the output information signal generated by the output combiner.

12. The circuit of claim 11, wherein the VCO center operating frequency is a sub-harmonic of the carrier frequency of the output information signal generated by the output combiner.

13. The circuit of claim 1, comprising a sideband combiner arranged to generate a single sideband output information signal in response to high-side injection of lower sidebands of the developed sidebands when a lower frequency carrier frequency is selected, and to generate the single sideband output information signal in response to low-side injection of higher sidebands of the developed sidebands when the higher frequency carrier frequency is selected, wherein the output combiner generates the output information signal in response to the single sideband output information signal, and wherein the selected carrier frequency is a frequency of either the input information signal or the output information signal.

14. A system, comprising:
   a voltage controlled oscillator (VCO) for generating a master frequency output signal in accordance with a selection of either a lower frequency carrier frequency or a higher frequency carrier frequency, wherein the master frequency output signal is generated at a first VCO frequency when the lower frequency carrier frequency is selected, wherein the master frequency output signal is generated at a second VCO frequency higher than the first VCO frequency when the higher frequency carrier frequency is selected, and wherein the VCO includes a tuning range encompassing the first and second VCO frequencies;
   a multiplication-order operation unit for generating local oscillator signals in quadrature in response to the maser frequency output signal; and
   a first one or more mixer stages for developing sidebands in response to a first received information signal and the local oscillator signals in quadrature, wherein the one or more mixer stages are arranged to generate an output information signal in response to high-side injection of lower sidebands of the developed sidebands when the lower frequency carrier frequency is selected, and wherein the first one or more mixer stages are arranged to generate the first output information signal in response to low-side injection of higher sidebands of the developed sidebands when the higher frequency carrier frequency is selected.

15. The system of claim 14, comprising:
a second one or more mixer stages for developing sidebands in response to a second received information signal and the local oscillator signals in quadrature, wherein the one or more mixer stages are arranged to generate a second output information signal in response to high-side injection of lower sidebands of the developed sidebands when the lower frequency carrier frequency is selected, and wherein the second one or more mixer stages are arranged to generate the second output information signal in response to low-side injection of higher sidebands of the developed sidebands when the lower frequency carrier frequency is selected.

16. The system of claim 15, wherein the first one or more mixer stages are arranged to phase shift components of the first output information signal with respect to a first antenna in an antenna array, and wherein the second one or more mixer stages are arranged to phase shift components of the second output information signal with respect to a second antenna in the antenna array.

17. The system of claim 15, wherein the first one or more mixer stages are arranged to phase shift components of the first input information signal with respect to a first antenna in an antenna array, wherein the second one or more mixer stages are arranged to phase shift components of the second input information signal with respect to a second antenna in the antenna array, wherein the first input information signal is received from the first antenna in the antenna array, and wherein the second input information signal is received from the second antenna in the antenna array.

18. The system of claim 17, including a processor for processing the first output information signal in accordance with the phase shifted components of the first input information signal, for processing the second output information signal in accordance with the phase shifted components of the second input information signal, to arrange the first and second one or more mixers for the high-side injection of the lower sidebands of the developed sidebands when the lower frequency carrier frequency is selected, and to arrange the first and second one or more mixers for the low-side injection of the higher sidebands of the developed sidebands when the higher frequency carrier frequency is selected.

19. A method, comprising:
generating a master frequency output signal in accordance with a selection of either a lower frequency carrier frequency or a higher frequency carrier frequency, wherein the master frequency output signal is generated at a first voltage controlled oscillator (VCO) frequency when the lower frequency carrier frequency is selected, wherein the master frequency output signal is generated at a second VCO frequency higher than the first VCO frequency when the higher frequency carrier frequency is selected, and wherein the VCO includes a tuning range encompassing the first and second VCO frequencies;
generating local oscillator signals in quadrature in response to the maser frequency output signal; and
developing sidebands in a first one or more mixer stages in response to a first received information signal and the local oscillator signals in quadrature, wherein the one or more mixer stages are arranged to generate an output information signal in response to high-side injection of lower sidebands of the developed sidebands when the lower frequency carrier frequency is selected, and wherein the first one or more mixer stages are arranged to generate the first output information signal in response to low-side injection of higher sidebands of the developed sidebands when the higher frequency carrier frequency is selected.

20. The method of claim 19, comprising:
developing sidebands in a second one or more mixer stages in response to a second received information signal and the local oscillator signals in quadrature, wherein the one or more mixer stages are arranged to generate a second output information signal in response to high-side injection of lower sidebands of the developed sidebands when the lower frequency carrier frequency is selected, and wherein the second one or more mixer stages are arranged to generate the second output information signal in response to low-side injection of higher sidebands of the developed sidebands when the lower frequency carrier frequency is selected.

* * * * *